United States Patent [19]

Tzori

[11] Patent Number: 5,748,875
[45] Date of Patent: May 5, 1998

[54] DIGITAL LOGIC SIMULATION/EMULATION SYSTEM

[75] Inventor: Yifatch Tzori, Sunnyvale, Calif.

[73] Assignee: Simpod, Inc., Santa Clara, Calif.

[21] Appl. No.: 661,991

[22] Filed: Jun. 12, 1996

[51] Int. Cl.[6] ............................................. G01R 31/28
[52] U.S. Cl. ........................... 395/183.05; 371/22.1;
364/221.2; 364/232.3; 364/264.3
[58] Field of Search ...................... 395/183.05, 183.04,
395/183.08, 183.15, 183.22, 183.02; 371/22.1,
22.2; 364/221.2, 232.3, 264.3

[56] References Cited

U.S. PATENT DOCUMENTS

| | | | |
|---|---|---|---|
| 4,590,581 | 5/1986 | Widdoes | 364/578 |
| 4,635,218 | 1/1987 | Widdoes | 364/578 |
| 4,691,316 | 9/1987 | Phillips | 395/183.05 |
| 4,744,084 | 5/1988 | Beck et al. | 371/28 |
| 5,068,852 | 11/1991 | Locke | 395/183.05 |
| 5,136,590 | 8/1992 | Polstra et al. | 395/183.05 |
| 5,146,460 | 9/1992 | Ackerman et al. | 371/23 |
| 5,325,365 | 6/1994 | Moore et al. | 395/183.05 |
| 5,353,243 | 10/1994 | Read et al. | 364/578 |
| 5,369,593 | 11/1994 | Papamarcos et al. | 364/488 |
| 5,528,752 | 6/1996 | Kise et al. | 395/183.05 |
| 5,546,562 | 8/1996 | Patel | 395/183.04 |

OTHER PUBLICATIONS

Synopsys, Inc. ModelSource 3000 Series brochure copyright 1995.
Virtual Machine Works, Inc. VirtuaLogic™ Emulation System brochure copyright 1996.

*Primary Examiner*—Hoa T. Nguyen
*Attorney, Agent, or Firm*—Donald E. Schreiber

[57] ABSTRACT

A digital logic simulation/emulation system, that includes a hardware pod having a configurable-logic IC arranged to provide a plurality of stimulus/response cells, is adapted for coupling to a digital logic circuit. The stimulus/response cells, which provide stimulus signals to the digital logic circuit, connect to form a shift-register for downloading stimulus-control data, and for uploading response data during a stimulation-response cycle. A logic-configuration library stores configuration-data for establishing a bit-slice architecture for the stimulus/response cells. To facilitate preparing the configuration-data, the system also includes a configurable-logic-specification process having a GUI user interface. The logic-specification process assigns pre-established, bit-slice configuration data for each logic-function cell to specific locations throughout a configurable-logic IC to achieve swift compilation of configuration data.

40 Claims, 16 Drawing Sheets

Microfiche Appendix Included
(4 Microfiche, 382 Pages)

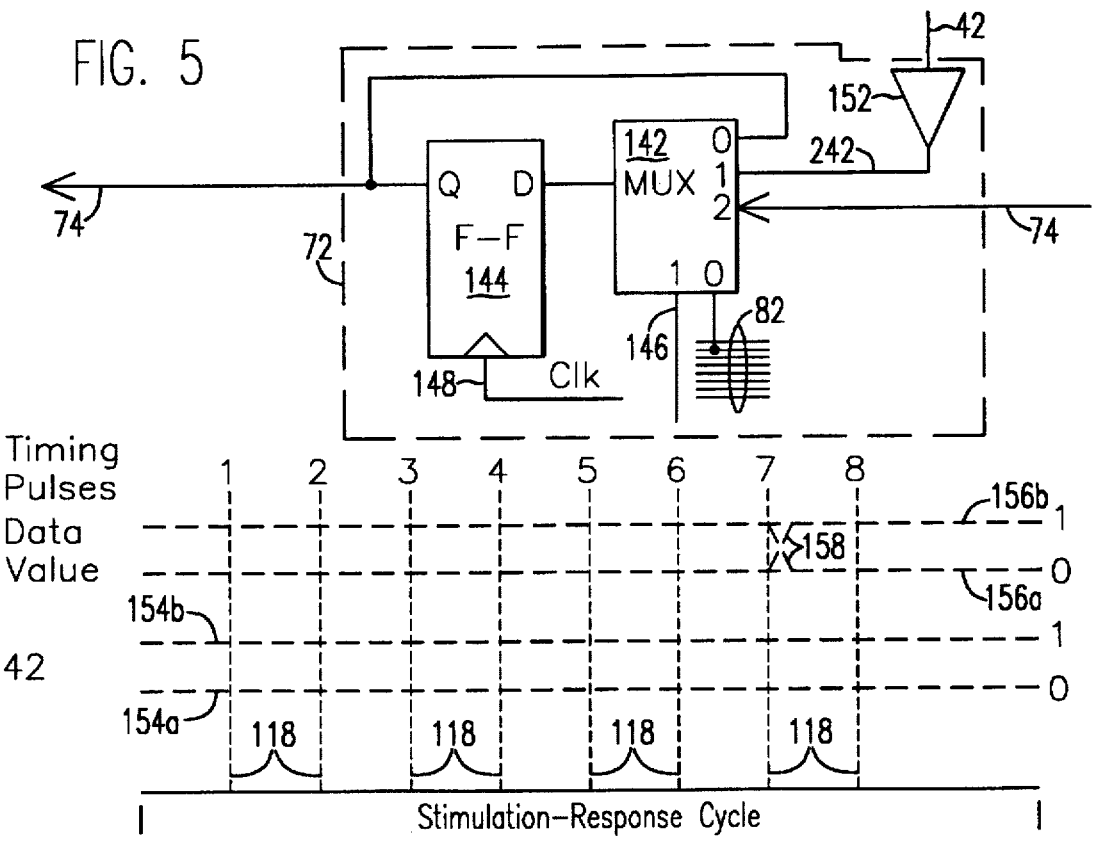
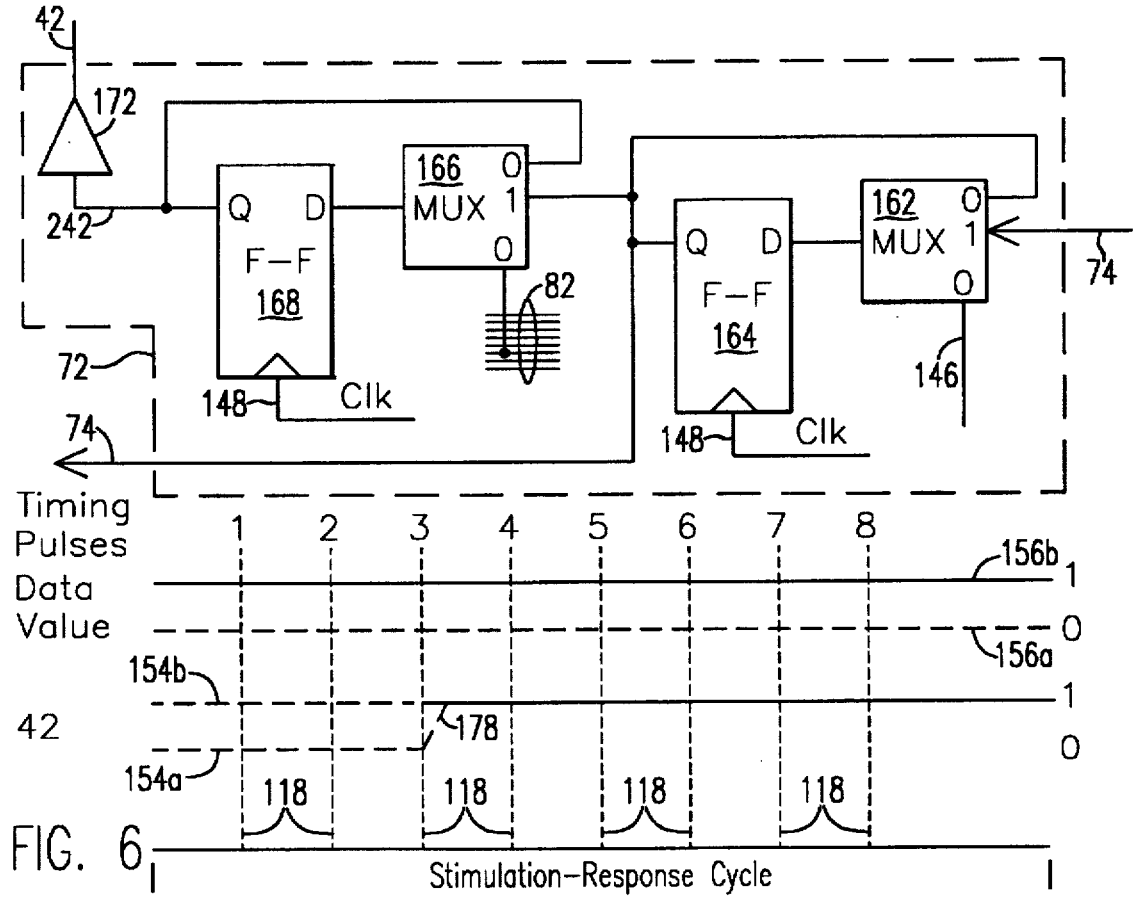

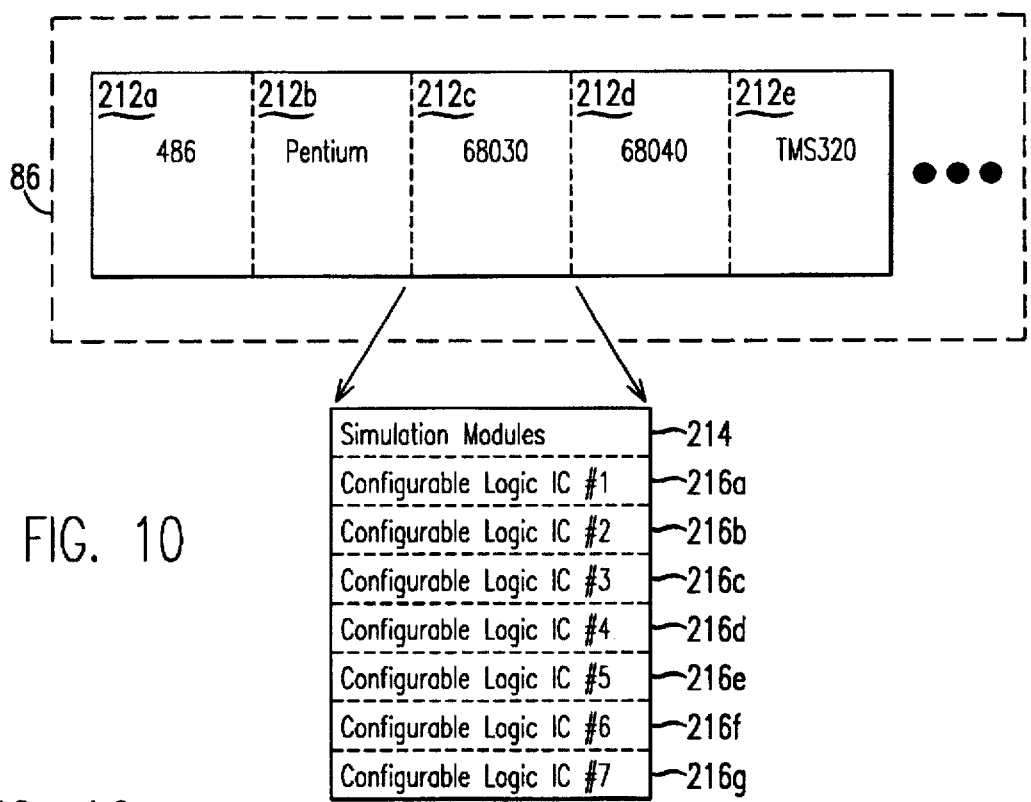
FIG. 10
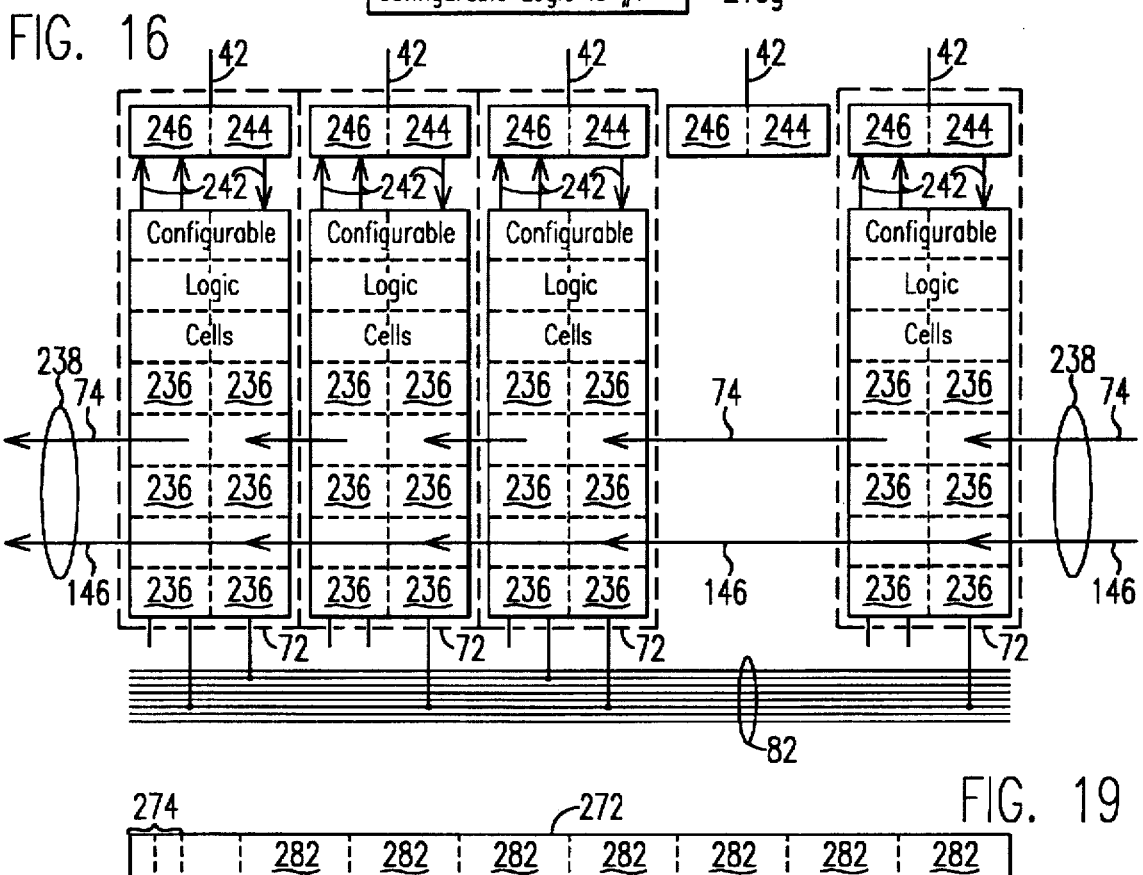
FIG. 16
FIG. 19

FIG. 12

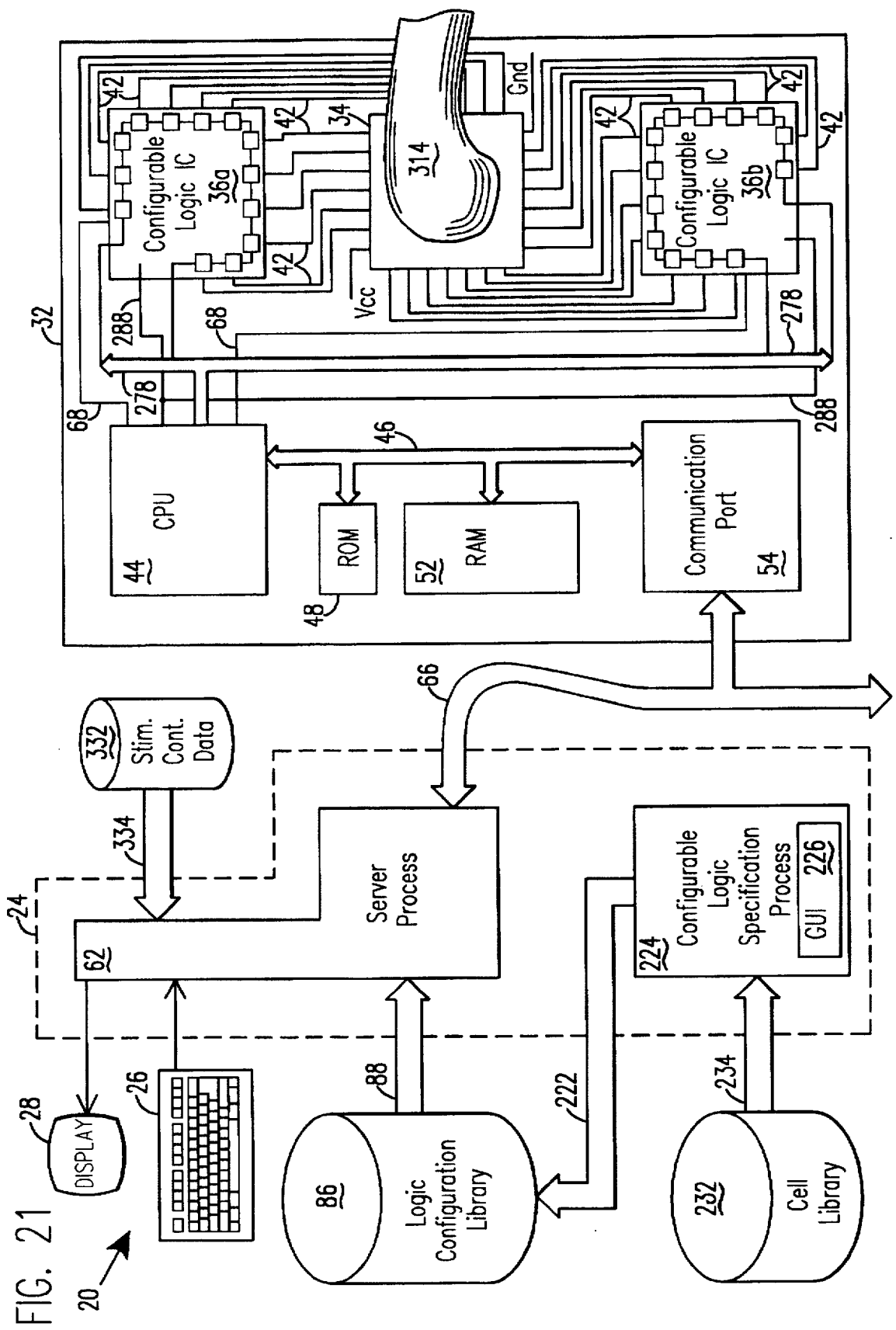

DIGITAL LOGIC SIMULATION/EMULATION SYSTEM

MICROFICHE APPENDIX

Appendix I, consisting of 4 microfiches having a total of 382 frames, in hereby included herein.

COPYRIGHT NOTICE

A portion of the disclosure of this patent document contains copyrighted material. The copyright owner hereby grants others a right to reproduce copies of the patent document or the patent disclosure exactly as it appears in the files of the United States Patent and Trademark Office, but otherwise reserves all copyright rights whatsoever.

BACKGROUND OF THE INVENTION

1. Field of the Invention

The present invention relates generally to digital logic simulation and emulation and, more particularly, to systems that stimulate a physical digital logic device included in the simulation or emulation, and retrieve responses produced by the stimulated logic device.

2. Description of the Prior Art

Various different software and hardware systems exist for simulating and/or emulating digital logic systems. An example of a widely used software system for simulating digital logic systems is an IEEE standard simulation programming language called Verilog. Various vendors, such as Cadence Design Systems of San Jose, Calif., offer compilers or interpreters for the Verilog simulation language. Software digital logic system simulators, such as Verilog, are routinely used for designing systems as physically small as individual integrated circuits ("ICs"), and for designing much larger digital logic systems that include numerous ICs. Performing a Verilog simulation requires that a digital logic designer employ a computer program model for the system by aggregating into a simulation computer program various software modules. The software modules making up a Verilog model include modules for each digital logic circuit included in the simulation, for specifying interconnections among the Verilog logic circuit modules, and for specifying timing relationships among the interconnected Verilog logic circuit modules. It is readily apparent that preparing a simulation computer program for a digital logic system that includes numerous ICs is a herculean task if the designer(s) must individually write Verilog modules for each digital logic circuit included in the system.

Since in almost all instances IC manufacturers simulate their designs before fabricating even a prototype, in principle a simulation model exists for each IC that is left over from the IC's development. Moreover, an IC manufacturer probably retains that simulation computer model for maintaining, fixing and enhancing the IC's design. However, because an IC's simulation model reveals details about the IC's design that manufacturers would prefer not revealing to actual or potential competitors, IC manufacturers rarely, if at all, make available to designers of systems that use the IC the simulation computer model developed in designing the IC. Moreover, even if the simulation computer model used for designing the IC were available, it would includes details about the IC's operation that are unnecessarily complicated for designing a digital logic system that incorporates the IC as a component part. Consequently, using an IC's design simulation computer program in simulating a larger digital logic system that includes the IC would, in most instances, produce simulation results no better than those obtainable using a much simpler simulation model for the IC, while at the same time markedly increasing the amount of computation required to simulate the larger digital logic system.

For the preceding reasons, there exist vendors, frequently unrelated to an IC's manufacturer, who provide designers of digital logic systems with a simulation model for a specific IC, and/or libraries of simulation models for simulating a number of different ICs frequently from a number of different IC manufacturers. However, because such third-party simulation models are simpler than the simulation model actually used in designing the IC, a possibility always exist that a third-party simulation model does not faithfully reproduce the IC, i.e. the third-party simulation model may contain latent bugs, or a third-party simulation model may not be available for a particular IC even though the IC is commercially available. It is readily apparent that a simulation model which contains a latent bug may produce correct simulation results when used in simulating some digital logic systems, while producing incorrect simulation results in simulating other digital logic systems. Moreover, if a simulation model is not available for a particular IC, then the designer of a digital logic system that includes the IC must write such a simulation model with the attendant risk that the computer model will be insufficiently faithful in reproducing the IC's operation.

In addition to software digital logic simulation, various vendors, such as QuickTurn Design Systems of Mountain View, Calif. and Virtual Machine Works of Cambridge, Mass., offer hardware systems for emulating digital logic systems. An example of such a hardware simulation system is a VirtuaLogic™ Emulation System offered by Virtual Machine Works. A VirtuaLogic emulation system divides a digital logic system, perhaps specified by a Verilog structural netlist, into separate parts which are then individual processed for configuring several Field Programmable Gate Arrays ("FPGAs"). The VirtuaLogic emulation then configures several FPGAs and suitably interconnects the FPGAs input and output pins to emulate the digital logic system.

One problem encountered in using FPGAs, either as configurable application specific integrated circuits ("ASICs") or in simulation or emulation, is a significant amount of time required to prepare a data file needed to configure the FPGA. The conventional way to prepare a FPGA configuration data file uses a technique referred to by those familiar with FPGAs as "place and route." While computer programs automate the "place and route" process for preparing a FPGA configuration data file, configuring a single FPGA using conventional "place and route" computer program may require several to tens of hours of computer time. Moreover, the conventional "place and route" computer program technique cannot guaranty producing a data file that will surely configure the FPGA for its intended purpose upon terminating the program's time consuming computation. Clearly, it is impractical to use a technique as cumbersome as the conventional "place and route" process for IC simulation or emulation if a dozen, or even one-half dozen, FPGA's must be configured before performing each simulation or emulation.

In addition to the polar opposites of digital logic system software simulation and digital logic system hardware emulation, there also exists intermediate systems that employ a hybrid of hardware and software for digital logic emulation or simulation. An example of a software-accessible, hardware IC emulation is called an in-circuit emulator ("ICE"). ICEs are commercially available which emulate a particular IC. In general, however, an ICE includes the physical IC that is being emulated, and adds to that IC additional circuitry which permits software monitoring of the IC's operation. Consequently, ICEs are comparatively inflexible, and there does not presently exist a general purpose ICE that will simulate any IC for which a simulation model exists.

There also exist another type of hybrid hardware and software system which incorporates a hardware IC model into a software digital logic simulation. An example of such a hardware IC model system is the ModelSource system marketed by Synopsys Logic Modeling of Mountain View, Calif. To incorporate a hardware IC model into a digital logic simulation using the ModelSource system, a logic designer must plug an IC mounted on a special purpose adapter board into a ModelSource system. A ModelSource processor, such as a workstation, interconnects the ModelSource system to a local area network, such as an Ethernet, over which the ModelSource workstation communicates with another workstation which runs the simulation computer program. During the simulation, if a change occurs in a signal that is applied to an input pin of the hardware-modeled IC, the pin change is transmitted via the local area network to the ModelSource processor. The ModelSource computer program running on the processor formats the pin change for the ModelSource system and transmits it to that system. The ModelSource system then presents the pin change to the IC and senses any change which occurs in a signal present on an output pin of the IC. The ModelSource system then returns the output pin changes plus the corresponding timing information to the simulation computer program via the local area network. Various aspects of similar systems which incorporate a hardware IC model into a digital logic simulation are disclosed in U.S. Pat. Nos. 4,744,084, 5,146,460, 5,353,243 and 5,369,593.

In addition to simulating an IC, a converse situation arises in which a simulation model exists for a particular IC, but the IC itself is not available when a digital logic system designer wants to begin implementing and testing a digital logic system which incorporates the IC. Alternatively, even though an IC is available for use in implementing and testing a digital logic system's design, analogous to the use of an ICE in designing and debugging a digital logic system, a designer may want or need to observe and monitor the IC's interaction with other circuit elements, such as other ICs. Under either of these circumstances, a digital logic system designer may find it desirable to introduce digital logic signals into an implementation of a digital logic system that represent results obtained from a software simulation of one or more ICs.

In addition to a requirement to simulate or emulate an entire IC, there also exists a need to effectively and efficiently simulate or emulate only a portion of an IC. Presently, there exist companies which sell or license designs that form only a portion or core of an entire IC design. For example, such a enterprise may have a design for a CPU that it wishes to sell or license to a second enterprise which then incorporates the CPU design into the second enterprise's IC design. However, before the second enterprise buys or licenses the first enterprise's design, the second enterprise wants to be certain that the first enterprise's design works properly, and is compatible with the remainder of the second enterprise's IC design. In theory, the first enterprise could easily satisfy the second enterprise's need to inspect and test the first enterprise's design by providing the second enterprise with a simulation computer program's source code for the first enterprise's design. Unfortunately, the first enterprise is usually reluctant to provide the second enterprise with the simulation language program's source code because providing that level of design detail may, and most likely will, divulge to third parties proprietary design techniques which the first enterprise employs, and which provide the first enterprise with a competitive advantage. One solution to the preceding dilemma is if the first enterprise provides the second enterprise with a net list for the design which contains all of the design's details without revealing the proprietary design techniques. Unfortunately, incorporating a net list representation of a design into a simulation usually yields an undesirably, or even unacceptably, slow simulation.

SUMMARY OF THE INVENTION

An object of the present invention is to provide designers of digital logic systems with a simple and cost effective simulation system that faithfully incorporates one or more ICs into a digital logic computer simulation program without requiring that simulation models for the ICs be included in the simulation computer program.

Conversely, another object of the present invention is to provide a emulation system that permits digital logic designers to swiftly and easily couple a computer program simulation of one or more ICs into a digital logic system to emulate those ICs.

Another object of the present invention is to provide a stimulation/emulation system that swiftly and easily adapts for interfacing between various different types of ICs and a digital logic computer simulation.

Another object of the present invention is to provide a swifter, and simpler method for configuring a configurable-logic IC.

Yet another object of the present invention is to provide a hardware pod for inclusion into a digital logic simulation/emulation system, and a digital logic simulation/emulation system whose use is simple and flexible, that is easy and economical to manufacture, and easy to maintain.

Briefly, the invention includes a hardware pod adapted for inclusion into a digital logic simulation/emulation system, and a digital logic simulation/emulation system which incorporates the hardware pod. In addition to the hardware pod, the digital logic simulation/emulation system includes a computer program digital-logic simulation process for modeling a digital logic system, such as a Verilog computer program, that is executed by a digital computer.

The hardware pod is adapted to be coupled to a digital logic circuit. For example, the hardware pod either receives an IC which is plugged into a socket that is included in the hardware pod, or the hardware pod includes a connector that permits plugging the hardware pod into a digital logic system. The hardware pod also includes a configurable-logic IC which is arranged to include a plurality of stimulus/response cells. The stimulus/response cells provide stimulus signals to the digital logic circuit during a stimulation-response cycle, or receive responses from the digital logic circuit during the stimulation-response cycle, or both. Further, the hardware pod includes a communication port for receiving stimulation-control data to be transmitted to the configurable-logic IC for controlling stimulation of the digital logic circuit during the stimulation-response cycle. The communication port also receives, for transmission from the hardware pod, response data which the configurable-logic IC receives from the digital logic circuit in response to stimulation thereof during the stimulation-response cycle.

The digital logic simulation/emulation system also includes server process that is coupled both to the digital-logic simulation process and to the hardware pod. The server process exchanges stimulation-control data and response data between the digital-logic simulation process and the hardware pod. In this way the digital-logic simulation process may transmit stimulation-control data through the server process to the hardware pod for controlling stimulation of the digital logic circuit by the stimulus/response cells during the stimulation-response cycle. Analogously, the digital-logic simulation process may also receive from the hardware pod through the server process response data from stimulus/response cells of the configurable-logic IC that reports the response of the digital logic circuit to stimulation during the stimulation-response cycle.

In a preferred embodiment, the digital logic simulation/emulation system also includes a logic-configuration library which stores a configuration-data file that contains logic-configuration data. The logic-configuration library is coupled to the server process which permits the server process to retrieve the configuration-data file from the logic-configuration library and transmit the configuration-data file to the hardware pod for configuring the configurable-logic IC. The logic-configuration data, upon being loaded into the configurable-logic IC of the hardware pod, establishes the plurality of stimulus/response cells in the configurable-logic IC. In the preferred embodiment, loading the logic-configuration data into the configurable-logic IC of the hardware pod also establishes a state machine for controlling the operation of the configurable-logic IC. Thus configured, the state machine controls the provision of stimulus signals to the digital logic circuit, and the receipt of responses from the digital logic circuit. The logic-configuration data also establishes within the configurable-logic IC a timing generator operating under the control of the state machine which establishes time intervals within the stimulation-response cycle during which individual stimulus/response cells either provide a stimulus signal to the digital logic circuit and/or receive a response from the digital logic circuit.

In the preferred embodiment of the digital logic simulation/emulation system, loading the configuration-data file into the configurable-logic IC of the hardware pod establish a bit-slice architecture for the stimulus/response cells in which the cells are coupled to each other to form a shift-register. The shift-register interconnection of the stimulus/response cells permits downloading bit-slice stimulation-control data into the configurable-logic IC to specify stimulation of the digital logic circuit during the stimulation-response cycle. The shift-register interconnection of the stimulus/response cells also permits uploading bit-slice response data from the configurable-logic IC that reports the response of the digital logic circuit to stimulation during the stimulation-response cycle. The logic-configuration data preferably establishes four (4) separate stimulus/response-cell groups, one group along each edge of the configurable-logic IC. Each stimulus/response-cell group forms a separate bit-slice architecture in which stimulus/response cells are coupled to each other to form a shift-register.

To facilitate preparation of the configuration-data file that contains logic-configuration data, the preferred embodiment of the digital logic simulation/emulation system also includes a configurable-logic-specification process. The configurable-logic-specification process is coupled both to the logic-configuration library and to a configurable-logic cell-library. The configurable-logic cell-library stores configuration data that specifies various different types of individual stimulus/response cells. The configurable-logic-specification process provides a user interface that permits:

1. selecting an individual stimulus/response cell from the configurable-logic cell-library for inclusion into a configuration-data file;
2. specifying a location for the selected stimulus/response cell with respect to the digital logic circuit; and
3. specifying a time interval within the stimulation-response cycle during which the selected stimulus/response cell operates for providing a stimulus signal to the digital logic circuit and/or receiving a response from the digital logic circuit.

After all stimulus/response cells have been selected and specified using the configurable-logic-specification process' user interface, the configurable-logic-specification process performs a compilation operation which produces a configuration-data file-set that is stored into the logic-configuration library.

To permit swiftly compiling configurable-logic configuration data for storage into the configuration-data file-set, the present invention compiles configuration data by assigning to specific locations throughout a configurable-logic IC pre-established configuration data for each logic-function cell. This pre-established configuration data is retrieved from a configurable-logic cell-library. The preferred embodiment of the present invention employs pre-established configuration data which specifies bit-slice logic-function cells which may be assigned to specific locations throughout the configurable-logic IC by merely juxtaposing the pre-established configuration data for immediately adjacent logic function cells.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 5 is a block diagram depicting a simple input stimulus/response cell that may be implemented in a configurable-logic IC such as that depicted in FIG. 2 together with a timing diagram illustrating operation of the stimulus/response cell;

FIG. 6 is a block diagram depicting simple output stimulus/response cell that may be implemented in a configurable-logic IC such as that depicted in FIG. 2 together with a timing diagram illustrating operation of the stimulus/response cell;

FIG. 10 is structure diagram depicting organization of files stored in the logic configuration library depicted in FIG. 1;

FIG. 12 depicts a screen display that, upon operator selection from the display depicted in FIG. 11, the GUI computer program presents to the operator for specifying characteristics of an input pin of the digital logic IC;

FIG. 16 is a block diagram illustrating assignment of stimulus/response cells to configurable-logic cells of a configurable-logic IC such as those depicted in FIGS. 1 and 2;

FIG. 19 is a diagram depicting a data word for transferring stimulation-control data and response data between the CPU and the configurable-logic IC depicted in FIG. 1 through the FIFO ICs depicted in FIG. 2;

FIG. 21 is a block diagram depicting an alternative embodiment of the digital logic simulation/emulation system of FIG. 1 which is coupled to a digital logic system by a multi-conductor cable, and that is adapted for higher-cycle, higher-speed simulation or emulation.

DETAILED DESCRIPTION OF THE PREFERRED EMBODIMENT

Figure 1:
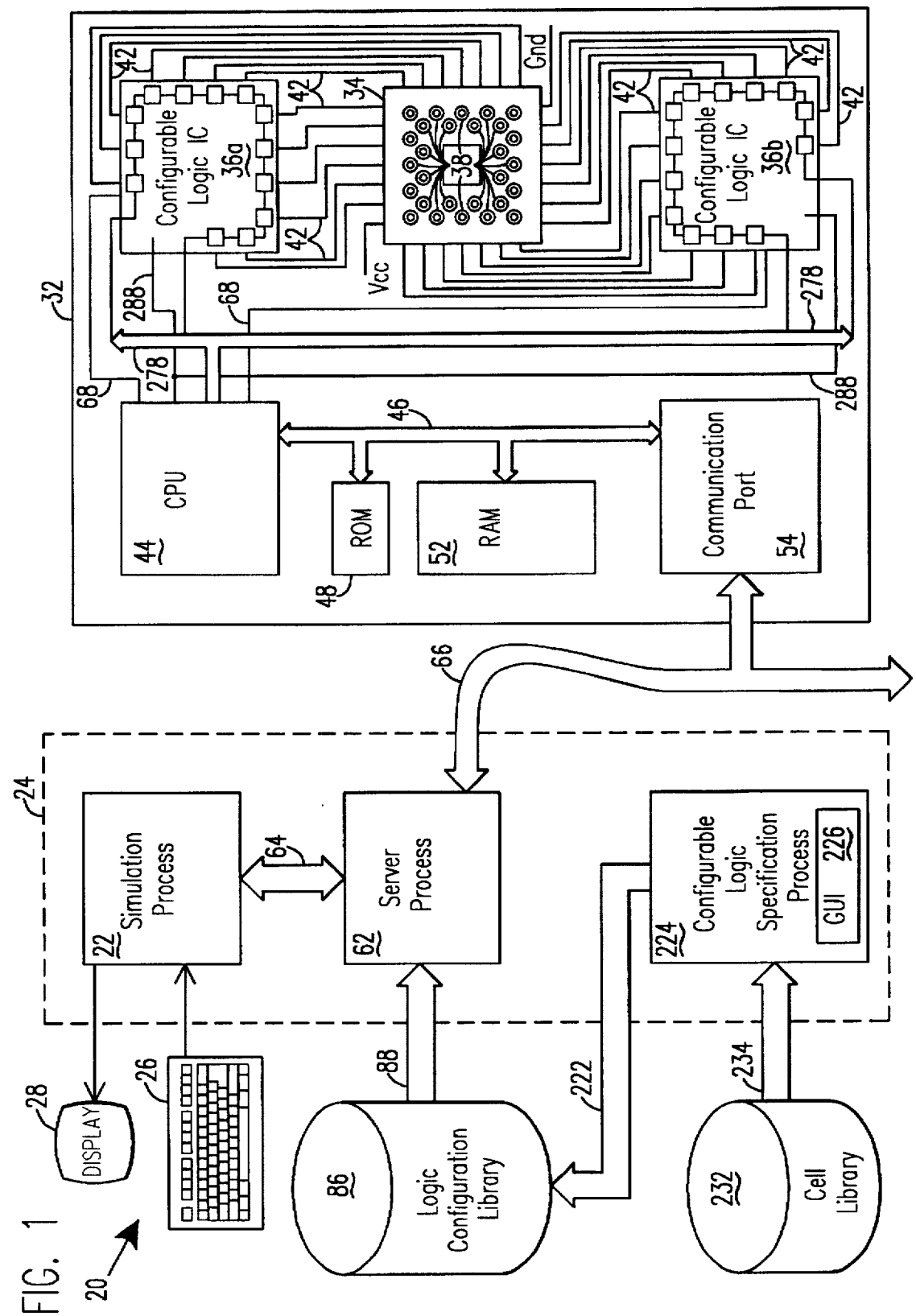
FIG. 1 is a block diagram depicting a digital logic simulation/emulation system in accordance with the present invention including a simulation process, a server process, a logic configuration library, and a hardware pod that includes a communication port, a RAM, a ROM, a CPU, one or more configurable-logic ICs, and a socket which may either receive a digital logic IC, or permit coupling the pod to a digital logic system, depending upon the using being made of the simulation/emulation system.

FIG. 1 is a block diagram depicting a digital logic simulation/emulation system in accordance with the present invention referred to by the general reference character 20. The digital logic simulation/emulation system 20 includes a computer program digital-logic simulation process 22 executed by a digital computer, indicated in FIG. 1 by a dashed line 24. The simulation process 22 models a digital logic system, and is preferably programmed in the a Verilog programming language. The digital computer 24 is preferably a Sun Microsystems, Inc. of Mountain View, Calif., SparcStation 4 workstation. The digital logic simulation/emulation system 20 also includes a keyboard 26 and a display 28 that are coupled to the simulation process 22 to permit monitoring of and interaction with the simulation process 22.

The digital logic simulation/emulation system 20 also includes a hardware pod 32 that, in the embodiment of the present invention illustrated in FIG. 1, is adapted to receive a digital logic IC by a zero insertion force ("ZIF") IC socket 34. In addition to the IC socket 34, the hardware pod 32 illustrated in FIG. 1 includes two (2) configurable-logic ICs 36a and 36b. All IC pin-receptacles 38 included in the IC socket 34 connect by individual printed circuit board traces 42 to the configurable-logic IC 36a or 36b.

The hardware pod 32 further includes a central processing unit ("CPU") 44 that preferably includes an Integrated Device Technology, Inc., of Santa Clara, Calif. R3081 MIPS R3000 derivative RISC microprocessor together with other ancillary ICs. A microprocessor bus 46 couples the CPU 44 to a read only memory ("ROM") 48, a random access memory ("RAM") 52 and to a communication port 54, which is preferably an Sonic Ethernet IC marketed by National Semiconductor, Inc. of Santa Clara, Calif. The ROM 48, which provides 512K bytes of storage, holds only a minimum computer program required to boot the CPU 44 sufficiently to permit receiving additional computer programs through the communication port 54. The RAM 52 provides 16M bytes of storage for:

1. a computer program executed by the CPU 44;
2. stimulation-control data used in programming the configurable-logic ICs 36a and 36b to stimulate a digital logic IC inserted into the IC socket 34 during a stimulation-response cycle; and
3. response data received by the configurable-logic ICs 36a and 36b from such digital logic IC during the stimulation-response cycle.

As depicted in FIG. 1, the digital logic simulation/emulation system 20 also includes a server process 62 which is coupled internally within the digital computer 24 by software to the simulation process 22 as indicated by a double-headed arrow 64. The server process 62 is also coupled by an Ethernet cable 66 to the hardware pod 32, and, if desired, to additional hardware pods 32 not illustrated in FIG. 1. The server process 62 exchanges stimulation-control data and response data between the simulation process 22 and the hardware pod 32. During the transfer of stimulation-control data from the simulation process 22, the communication port 54 receives data to be transmitted to the configurable-logic IC 36a or 36b for controlling stimulation of the digital logic IC by the configurable-logic ICs 36a and 36b during the stimulation-response cycle. During a transfer of response data from the hardware pod 32, the communication port 54 transmits response data which the configurable-logic ICs 36a and 36b receive from the digital logic IC in response to stimulation thereof during the stimulation-response cycle.

Figure 2:
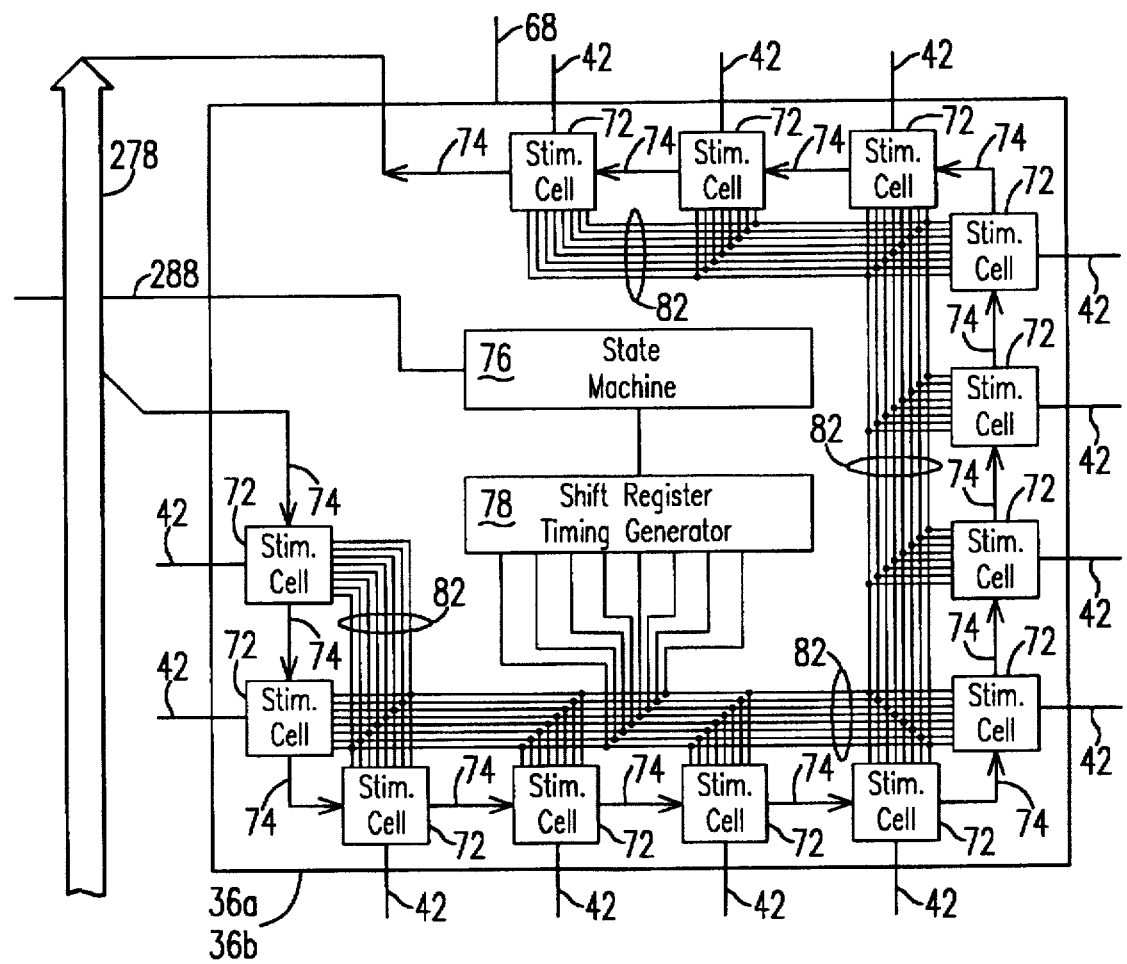
FIG. 2 is a block diagram depicting functional elements configured into the configurable-logic IC included in the pod depicted in FIG. 1 including a plurality of stimulus/response cells, a state machine, a timing generator, and input and output first-in first-out ("FIFO") ICs.

Referring now to the block diagram of FIG. 2, the configurable-logic ICs 36a and 36b are both preferably AT6005 fine-grain FPGAs marketed by Atmel Corporation of San Jose, Calif. As described in greater detail in a "Configurable Logic Design and Application Book," copyright 1995 by Atmel Corporation that is incorporated herein by reference, the AT6005 is a SRAM-Based FPGA which provides a symmetric matrix of small, yet powerful configurable digital logic cells connected to a flexible bussing network. The FPGA's symmetric matrix is surrounded by programmable I/O cells that connect to pins of the FPGA IC. As well known to those familiar with FPGAs and as described in greater detail in the "Configurable Logic Design and Application Book," the AT6005 FPGA is configured to operate as a particular digital logic circuit by supplying configuration data, usually formatted as a configuration bit-stream, to at least one configuration input pin 68 of the FPGA. Within the FPGA, this configuration data moves via a built-in shift-register through the FPGA's symmetric matrix so that after a specified number of bits have been supplied to the FPGA, the FPGA is fully configured.

As illustrated in the block diagram of FIG. 2, the configuration data, that is supplied to the configuration input pin 68, upon being loaded into the configurable-logic ICs 36a and 36b establishes within the configured FPGA a bit-slice architecture in which a plurality of stimulus/response cells 72 are located around the FPGA's symmetric matrix's periphery. The configuration data also causes each of the stimulus/response cells 72 to be coupled through a FPGA programmable I/O cell, a FPGA pin (neither of which are separately illustrated in FIG. 2), and one of the traces 42 of the hardware pod 32 to a specific IC pin-receptacle 38 of the ZIF IC socket 34.

In addition to forming the stimulus/response cells 72 that are coupled to the IC pin-receptacles 38, loading the configuration data into the configurable-logic ICs 36a and 36b also interconnects the stimulus/response cells 72 to each other by shift-register links 74 thereby establishing a shift-register that extends through the stimulus/response cells 72. The shift-register formed within the configurable-logic ICs 36a and 36b by the interdigitated stimulus/response cells 72 and shift-register links 74 begins and ends at separate FPGA pins (not separately illustrated in any of the FIGs.) The shift-register thus established by the configuration data loaded into the configurable-logic ICs 36a and 36b permits downloading into the stimulus/response cells 72 stimulation-control data of a bit-slice data stream which specifies stimulation of the digital logic IC by the configurable-logic ICs 36a and 36b during the stimulation-response cycle. The shift-register also permits uploading from the stimulus/response cells 72 of the configurable-logic ICs 36a and 36b response data of a bit-slice data stream that reports the response of the digital logic IC to stimulation during the stimulation-response cycle.

In addition to establishing the stimulus/response cells 72 and the shift-register links 74, the logic-configuration data loaded into the configurable-logic ICs 36a and 36b also establishes both a state machine 76 and a shift-register timing generator 78. The state machine 76 provides shift-pulses to the stimulus/response cells 72 to coordinate movement of stimulation-control data and response data through the shift-register formed by the interdigitated stimulus/response cells 72 and shift-register links 74. The state machine 76, via the timing generator 78, also controls the operation of the configurable-logic ICs 36a and 36b in providing stimulus signals to the digital logic IC and in receiving responses from the digital logic IC. The timing generator 78 establishes time intervals within the stimulation-response cycle during which individual stimulus/response cells 72 either provide a stimulus signal to the digital logic IC and/or receive a response signal from the digital logic IC. The logic-configuration data loaded into the configurable-logic ICs 36a and 36b also establishes a timing-signal bus 82 that couples the timing intervals generated by the timing generator 78 to all of the stimulus/response cells 72 included in each of the configurable-logic ICs 36a and 36b.

The stimulus signals supplied to pins of a digital logic IC by several configurable-logic ICs included in the hardware pod 32 and receipt of response signals by those configurable-logic ICs during each stimulation-response cycle must necessarily be synchronized. That is, the stimulus signals from all configurable-logic ICs in the hardware pod 32 must arrive in phase at the digital logic IC, and the configurable logic IC's must receive response signals from the digital logic IC in phase. This synchronization of several configurable-logic ICs is effected by mounting all of the configurable-logic ICs on a single printed circuit board, and by supplying a common clock signal to all the configurable-logic ICs.

To supply logic-configuration data to the configurable-logic ICs 36a and 36b, the digital logic simulation/emulation system 20 also includes a logic-configuration library 86 which stores a configuration-data file that contains the logic-configuration data loaded into the configurable-logic ICs 36a and 36b. As indicated by an arrow 88, the logic-configuration library 86 is coupled to the server process 62 which permits the server process 62 to retrieve the configuration-data file from the logic-configuration library 86 and transmit the logic-configuration data to the hardware pod 32 for configuring the configurable-logic ICs 36a and 36b.

The logic-configuration data retrieved from the logic-configuration library 86 and loaded into the configurable-logic ICs 36a and 36b only pertains to stimulus signals to be applied to pins of a digital logic IC and/or response signals to be received from a digital logic IC. Supplying electrical power, such as Vcc, to specific pins of the IC is performed during set up of the hardware pod 32 by manually installing jumpers which couple such power to individual pins of the digital logic IC. Accordingly every trace 42 of the hardware pod 32 connects both to a IC pin-receptacle 38 of the IC socket 34, to a pin of the configurable-logic IC 36a or 36b, and to a jumper pin not illustrated in any of the FIGs. If a particular IC pin-receptacle 38 of the IC socket 34 is to connect to electrical ground or to electrical power, then a jumper is manually installed between the trace 42 connected to that IC pin-receptacle 38 and either electrical circuit ground ("Gnd") or electrical power ("Vcc").

Simulation/Emulation Operation of the System 20

Figure 3:
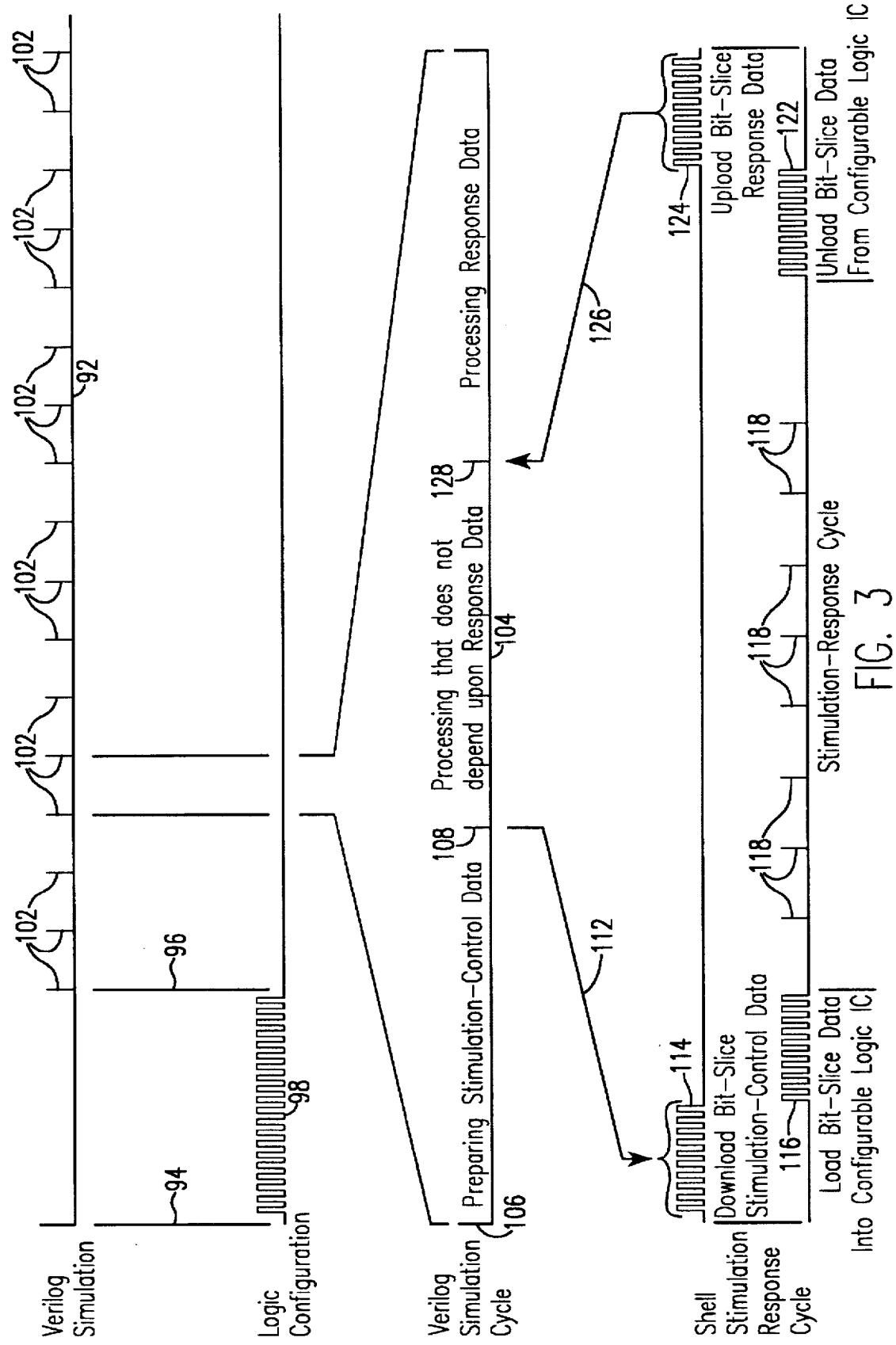
FIG. 3 is a timing diagram illustrating simulation or emulation of digital logic using the simulation/emulation system depicted in FIG. 1.

Referring now to the timing diagram of FIG. 3, a horizontal line 92 at the top of FIG. 3 depicts execution of the computer program digital-logic simulation process 22, such as the preferred Verilog simulation. The simulation process 22 commences at the left hand end of the horizontal line 92 with an initialization interval that begins at a vertical line 94 and concludes at a vertical line 96. During the initialization interval, as illustrated by a pulse train 98 the server process 62 retrieves logic-configuration data from the logic-configuration library 86 and transmits such data to the hardware pod 32. Within the hardware pod 32, the logic configuration data is loaded into the configurable-logic ICs 36a and 36b thereby configuring the configurable-logic ICs 36a and 36b for the remainder of the simulation. After completing the initialization interval, the simulation process 22 performs a sequence of simulation cycles, which in the timing diagram of FIG. 3 occur between immediately adjacent pairs of short vertical lines 102.

A horizontal line 104 about the middle of FIG. 3 illustrates a typical simulation cycle of the simulation process 22. During an initial interval in the simulation cycle between a vertical line 106 and a vertical line 108 the simulation process 22 prepares stimulation-control data to be transmitted to the hardware pod 32 for stimulating a digital logic IC inserted into the IC socket 34. After the simulation process 22 has prepared all the device input data required to stimulate the digital logic IC, as indicated by an arrow 112 a "shell" module included in the simulation process 22, that represents the digital logic IC within the simulation process 22, downloads the bit-slice stimulation-control data through the server process 62 into the RAM 52 of the hardware pod 32 as indicated in FIG. 3 by a pulse train 114. After the shell module has downloaded the bit-slice data into the hardware pod 32, the simulation process 22 may resume the simulation to perform processing that does not depend upon response data from the digital logic IC plugged into the IC socket 34.

After the bit-slice data has been loaded into the RAM 52, via the shift-register formed by the shift-register links 74 interconnecting adjacent stimulus/response cells 72, the computer program executed by the CPU 44 fetches the bit-slice stimulation-control data from the RAM 52 and loads that data into the configurable-logic ICs 36a and 36b as indicated by a pulse train 116 in FIG. 3. Loading the stimulation-control data into the configurable-logic ICs 36a and 36b specifies the stimulus signals which various stimulus/response cells 72 are to supply to digital logic IC during the stimulation-response cycle.

After the bit-slice stimulation-control data has been loaded into the configurable-logic ICs 36a and 36b, to perform the stimulation-response cycle the state machine 76 causes the timing generator 78 to transmit a sequence of timing pulses, indicated in FIG. 3 by vertical lines 118, to all of the stimulus/response cells 72 via the timing-signal bus 82. During the stimulation-response cycle, there can be no fewer that two (2) timing pulses transmitted by the timing generator 78, and there are preferably eight (8) timing pulses transmitted by the timing generator 78. During the successive time intervals established by the timing pulses transmitted by the timing generator 78, each individual stimulus/response cell 72, in accordance with the logic-configuration data loaded into the configurable-logic ICs 36a and 36b and in accordance with the stimulation-control data loaded into the stimulus/response cells 72, transmits a stimulus signal to the digital logic IC plugged into the IC socket 34 and/or receives a response signal from the IC. Transmission of all the pulses by the timing generator 78 concludes the stimulation-response cycle, and the responses of the digital logic IC to the stimulus signals are present in various stimulus/response cells 72.

At the conclusion of the stimulation-response cycle, via the shift-register formed by the shift-register links 74 interconnecting adjacent stimulus/response cells 72, the computer program executed by the CPU 44 retrieves the bit-slice response data from the configurable-logic ICs 36a and 36b, indicated by a pulse train 122 in FIG. 3, and stores that data into the RAM 52. After the response data has been loaded into the RAM 52, the communication port 54 retrieves that data from the RAM 52, indicated by the pulse train 124, and transmits the response data through the server process 62 back to the shell module of the simulation process 22 as indicated by the arrow 126 in FIG. 3.

After the simulation process 22 receives the response data, the simulation process 22 commences a final phase of the simulation cycle, which begins at a vertical line 128, during which the computer program digital-logic simulation process 22 processes response data from the digital logic IC. After the simulation process 22 completes processing of the response data, it immediately commences the next simulation cycle.

Figure 4:
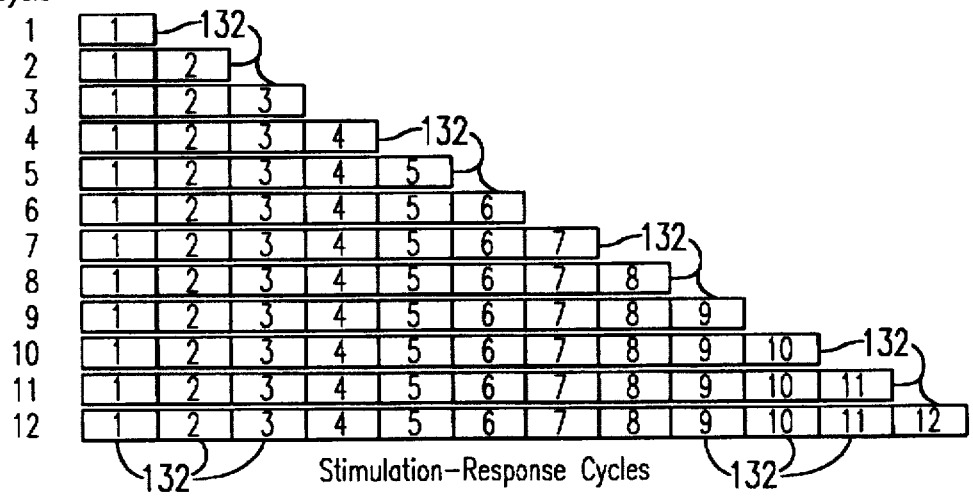
FIG. 4 is a timing diagram depicting stimulation by the digital logic simulation/emulation system depicted in FIG. 1 of an IC for which the IC's state fades if the IC operates below some minimum frequency.

If state of a digital logic IC plugged into the IC socket 34 "fades" over time, for example if the digital logic IC includes a phase locked loop, the preceding operation of the hardware pod 32 during the stimulation-response cycle must be augmented to properly establish such IC state during the stimulation-response cycle. For a digital logic IC whose state fades, the hardware pod 32 preserves in the RAM 52 a history of the stimulation-control data for each successive simulation cycle of the simulation process 22, e.g. simulation cycles one (1) through twelve (12) depicted in FIG. 4. Then, during each successive simulation cycle executed by the simulation process 22, the computer program executed by the CPU 44 performs a sequence of stimulation-response cycles, each one of which is indicated in FIG. 4 by a rectangle 132 enclosing a number. The computer program executed by the CPU 44 begins each stimulation-response cycle in the sequence beginning with the pulse train 116, depicted in FIG. 3, and ending with the pulse train 122, also depicted in FIG. 3, for all the stored stimulation-control data beginning with such data for the initial stored stimulation-response cycle, and ending with such data the final stored stimulation-response cycle. At the conclusion of the final stimulation-response cycle the hardware pod 32 transmits the response data for the final stimulation-response cycle in the sequence of cycles to the server process 62 for re-transmission to the simulation process 22.

Types of Stimulus/Response Cells 72

Providing proper stimulus signals to pins of various different types of digital logic ICs and properly receiving response signals from pins of such ICs requires that the digital logic simulation/emulation system 20 be capable of configuring the configurable-logic ICs 36a and 36b to have stimulus/response cells 72 which operate in various different ways. The table set forth below summarizes various different types of stimulus/response cells 72 that may be configured into the configurable-logic ICs 36a and 36b.

Input Cells
  Simple Input Cell
    One response per stimulation-response cycle
    Two responses per stimulation-response cycle
Output Cells
  Simple Output Cell
    One transition per stimulation-response cycle
    Two transitions per stimulation-response cycle
  Tri-State Output Cell
    One transition per stimulation-response cycle
    Two transitions per stimulation-response cycle Pulse Output Cell
  Without an enable signal
  With an enable signal
Bidirectional Cells
  One transition per stimulation-response cycle
  Two transitions per stimulation-response cycle
Simple Input Cell Referring now to FIG. 5, depicted there is a block diagram for a simple input stimulus/response cell 72 that may be implemented in the configurable-logic IC 36a or 36b together with a timing diagram illustrating operation of the simple input stimulus/response cell 72. The stimulus/response cell 72 depicted in FIG. 5 includes a three data input-terminal and two control input-terminal shift-register multiplexer 142, and a bit-stream data-storage flip-flop 144. The shift-register multiplexer 142 and the bit-stream data-storage flip-flop 144 are both established by configuration data that is loaded into the configurable-logic IC 36a or 36b during the initialization interval of the simulation process 22 depicted in FIG. 3 between the vertical line 94 and the vertical line 96. As described above, before the stimulus/response cells 72 may perform a stimulation-response cycle, the bit-slice stimulation-control data must be loaded into all of the stimulus/response cells 72 included in the configurable-logic ICs 36a and 36b.

During loading of the bit-slice stimulation-control data, via the shift-register link 74 depicted at the right hand side of FIG. 5, the immediately preceding stimulus/response cell 72 in the shift-register supplies the data value for a bit in the bit-stream stimulation-control data to a "2" data input-terminal of the shift-register multiplexer 142. Configuration data loaded into the configurable-logic IC 36a or 36b also causes the state machine 76 to periodically transmit a shift-pulse, via a shift-pulse signal-line 146, to a "1" control input-terminal of the shift-register multiplexer 142. Upon receiving the shift-pulse, the shift-register multiplexer 142 transmits the data value present at the "2" data input-terminal to a "D" input-terminal of the bit-stream data-storage flip-flop 144. Subsequently, via a clock signal-line 148 a master clock-pulse for the configurable-logic ICs 36a and 36b is applied to a clock-signal input-terminal of the bit-stream data-storage flip-flop 144, indicated by a "Λ" within the bit-stream data-storage flip-flop 144. Receipt of the master clock-pulse causes the bit-stream data-storage flip-flop 144 to store the data value then present at the "D" input-terminal, and to transmit that same data value from a "Q" output-terminal of the bit-stream data-storage flip-flop 144. The "Q" output-terminal of the bit-stream data-storage flip-flop 144 connects to a "0" data input-terminal of the shift-register multiplexer 142. While the signals applied to a "0" and to the "1" control input-terminals of the shift-register multiplexer 142 are negated, the shift-register multiplexer 142 transmits the data value present at its "0" data input-terminal to the "D" input of the bit-stream data-storage flip-flop 144. In this way the stimulus/response cell 72 loads and stores a single bit of the bit-slice stimulation-control data upon each occurrence of the shift-pulse transmitted to the shift-register multiplexer 142 via the shift-pulse signal-line 146. Moreover, because the "Q" output-terminal of the bit-stream data-storage flip-flop 144 supplies the data value which it holds to the shift-register link 74 connecting the stimulus/response cell 72 to the subsequent stimulus/response cell 72 in the shift-register, the stimulus/response cell 72 depicted in FIG. 5 presents the data value stored in the bit-stream data-storage flip-flop 144 to the subsequent stimulus/response cell 72 in the shift-register.

The stimulus/response cell 72 depicted in FIG. 5 also includes an input buffer-amplifier 152 of a programmable I/O cell such as those included in the preferred AT6005 FPGA. An input-terminal of the input buffer-amplifier 152 connects via one of the traces 42 to a pin of the digital logic IC, while an output-terminal of the input buffer-amplifier 152 connects to a "1" data input-terminal of the shift-register multiplexer 142. The configuration data loaded into the configurable-logic IC 36a or 36b couples a "0" control input-terminal of the shift-register multiplexer 142 to a timing-signal line included in the timing-signal bus 82. Thus, when the shift-register multiplexer 142 receives a timing-signal pulse from the timing generator 78 via the timing-signal bus 82, the shift-register multiplexer 142 couples the signal present at the "1" data input-terminal to the "D" input of the bit-stream data-storage flip-flop 144. Subsequent receipt by the bit-stream data-storage flip-flop 144 of the next master clock-pulse from the clock signal-line 148 stores the data value transmitted from a pin of a digital logic IC installed into the IC socket 34 into the stimulus/response cell 72. As described previously, coupling of the "Q" output of the bit-stream data-storage flip-flop 144 to the "0" data input-terminal of the shift-register multiplexer 142 maintains the stored data value within the stimulus/response cell 72 after the timing generator 78 removes the timing-signal pulse from the "0" control input-terminal of the shift-register multiplexer 142.

As will be readily recognized by those skilled in the art, the configuration data loaded into the configurable-logic IC 36a or 36b may arbitrarily connect the "0" control input-terminal of the shift-register multiplexer 142 to any of the lines included in the timing-signal bus 82. Consequently, the simple input stimulus/response cell 72 depicted in FIG. 5 may store the data value present on the trace 42 in response to any one of the eight (8) timing-signal pulses produced by the timing generator 78 during each stimulation-response cycle. Moreover, if the stimulus/response cell 72 were erroneously configured to be connected to two or more lines of the timing-signal bus 82, then the data value present in the stimulus/response cell 72 at the end of the stimulation-response cycle will be that present on the trace 42 following the highest numbered timing-signal pulse received by the "0" control input-terminal of the shift-register multiplexer 142.

The vertical lines 118 in the timing diagram included in FIG. 5 represent eight (8) timing-signal pulses transmitted from the timing generator 78 during the stimulation-response cycle. The illustration of FIG. 5 depicts coupling the seventh timing-signal pulse, represented in FIG. 5 by a vertical line 118, from the timing-signal bus 82 to the "0" control input-terminal of the shift-register multiplexer 142. In the timing diagram of FIG. 5, dashed lines 154a and 154b extending horizontally across the stimulation-response cycle indicate that the signal supplied to the stimulus/response cell 72 via the shift-register multiplexer 142 may have either a logical zero (0) or a logical (1) data value. Segments of dashed lines 156a and 156b extending horizontally across the stimulation-response cycle to the left of timing-signal pulse number seven indicate that prior to that timing-signal pulse the stimulus/response cell 72 may store either a logical zero (0) or a logical (1) data value. Segments of the dashed lines 156a and 156b extending to the right of timing-signal pulse number seven indicate that subsequent to that timing-signal pulse the stimulus/response cell 72 may also store either a logical zero (0) or a logical (1) data value. However, crossed dashed lines 158 immediately to the right of timing-signal pulse number seven indicate that, after that timing-signal pulse and after the immediately succeeding master clock pulse, the data value held by the stimulus/response cell 72 will be the same as that present on the trace 42 represented in FIG. 5 by the dashed lines 154a and 154b.

Simple Output Cell

Referring now to FIG. 6, depicted there is a block diagram for a simple output stimulus/response cell 72 that may be implemented in the configurable-logic IC 36a or 36b, together with a timing diagram illustrating operation of the simple output stimulus/response cell 72. The stimulus/response cell 72 depicted in FIG. 6 includes a two data input-terminal and one control input-terminal shift-register multiplexer 162, a bit-stream data-storage flip-flop 164, a two data input-terminal and one control input-terminal output-signal multiplexer 166, and an output-signal flip-flop 168. The shift-register multiplexer 162, the bit-stream data-storage flip-flop 164, the output-signal multiplexer 166, and the output-signal flip-flop 168 are all established by configuration data that is loaded into the configurable-logic IC 36a or 36b during the initialization interval of the simulation process 22 depicted in FIG. 3 between the vertical line 94 and the vertical line 96. As described above, before the stimulus/response cells 72 may perform a stimulation-response cycle, the bit-slice stimulation-control data must be loaded into all of the stimulus/response cells 72 included in the configurable-logic ICs 36a and 36b.

During loading of the bit-slice stimulation-control data, via the shift-register link 74 depicted at the right hand side of FIG. 6, the immediately preceding stimulus/response cell 72 in the shift-register supplies the data value for a bit in the bit-stream stimulation-control data to a "1" data input-terminal of the shift-register multiplexer 162. The state machine 76 periodically transmits a shift-pulse, via a shift-pulse signal-line 146, to a "0" control input-terminal of the shift-register multiplexer 162. Upon receiving the shift-pulse, the shift-register multiplexer 162 transmits the data value present at the "1" data input-terminal to a "D" input-terminal of the bit-stream data-storage flip-flop 164. Subsequently, via a clock signal-line 148, a master clock-pulse for the configurable-logic ICs 36a and 36b is applied to a clock-signal input-terminal of the bit-stream data-storage flip-flop 164, indicated by a "Λ" within the bit-stream data-storage flip-flop 164. The "Q" output-terminal of the bit-stream data-storage flip-flop 164 connects to a "0" data input-terminal of the shift-register multiplexer 162. While the signal applied to the "0" control input-terminal of the shift-register multiplexer 162 is negated, the shift-register multiplexer 162 transmits the data value present at its "0" data input-terminal to the "D" input of the bit-stream data-storage flip-flop 164. In this way the stimulus/response cell 72 loads and stores a single bit of the bit-slice stimulation-control data upon each occurrence of the shift-pulse transmitted to the shift-register multiplexer 162 via the shift-pulse signal-line 146. Moreover, because the "Q" output-terminal of the bit-stream data-storage flip-flop 164 supplies the data value which it holds to the shift-register link 74 connecting the stimulus/response cell 72 to the subsequent stimulus/response cell 72 in the shift-register, the stimulus/response cell 72 depicted in FIG. 6 presents the data value stored in the bit-stream data-storage flip-flop 164 to the subsequent stimulus/response cell 72 in the shift-register.

A "1" data input-terminal of the output-signal multiplexer 166 also receives the data value stored in the bit-stream data-storage flip-flop 164. The configuration data loaded into the configurable-logic IC 36a or 36b couples a "0" control input-terminal of the output-signal multiplexer 166 to a timing-signal line included in the timing-signal bus 82. Thus, when the output-signal multiplexer 166 receives a timing-signal pulse from the timing generator 78 via the timing-signal bus 82, the output-signal multiplexer 166 couples the signal present at the "1" data input-terminal to the "D" input of the output-signal flip-flop 168. Receipt of the master clock-pulse causes the output-signal flip-flop 168 to store the data value then present at the "D" input-terminal, and to transmit that same data value from a "Q" output-terminal of the output-signal flip-flop 168. Coupling of the "Q" output of the output-signal flip-flop 168 to the "0" data input-terminal of the output-signal multiplexer 166 maintains the data value stored within the output-signal flip-flop 168 after the timing generator 78 removes the timing-signal pulse from the "0" control input-terminal of the shift-register multiplexer 162.

The stimulus/response cell 72 depicted in FIG. 6 also includes an output buffer-amplifier 172 of a programmable I/O cell such as those included in the preferred AT6005 FPGA. An input-terminal of the output buffer-amplifier 172 is coupled to the "Q" output-terminal of the output-signal flip-flop 168 to receive the data value present in the output-signal flip-flop 168. An output-terminal of the output buffer-amplifier 172 connects via one of the traces 42 to a pin of the digital logic IC. In this way, upon the transmission of the timing-signal pulse from the timing generator 78 which is coupled to the "0" terminal of the output-signal multiplexer 166, the stimulus/response cell 72 depicted in FIG. 6 transmits to a pin of the digital logic IC the stimulation-response data value then stored within the bit-stream data-storage flip-flop 164.

As will be readily recognized by those skilled in the art, the configuration data loaded into the configurable-logic IC 36a or 36b may arbitrarily connect the "0" control input-terminal of the output-signal multiplexer 166 to any of the lines included in the timing-signal bus 82. Consequently, the simple output stimulus/response cell 72 depicted in FIG. 6 may transfer the data value present in the bit-stream data-storage flip-flop 164 to the output-signal flip-flop 168 for transmission from the output buffer-amplifier 172 in response to any one of the eight (8) timing-signal pulses produced by the timing generator 78 during each stimulation-response cycle. Moreover, if the stimulus/response cell 72 were erroneously configured to be connected to two or more lines of the timing-signal bus 82, the data value present in the bit-stream data-storage flip-flop 164 will be transferred to the output-signal flip-flop 168 and applied to the trace 42 by the output buffer-amplifier 172 in response to the first timing-signal pulse, and all subsequent timing-signal pulses will not alter the stimulus applied to the pin of the digital logic IC.

The vertical lines 118 in the timing diagram included in FIG. 6 represent eight (8) timing-signal pulses transmitted from the timing generator 78 during the stimulation-response cycle. The illustration of FIG. 6 depicts coupling the third timing-signal pulse, represented by a vertical line 118, from the timing-signal bus 82 to the "0" control input-terminal of the output-signal multiplexer 166. In the timing diagram of FIG. 6, a solid line 156a extending horizontally across the stimulation-response cycle indicates that a logical one (1) data value is present in the bit-stream data-storage flip-flop 164 throughout the stimulation-response cycle. A dashed line 156a extending horizontally across the stimulation-response cycle indicates that a logical zero (0) data value could be present in the bit-stream data-storage flip-flop 164 throughout the stimulation-response cycle instead of the logical (1) data value if a logical zero (0) data value were stored into the bit-stream data-storage flip-flop 164 during the loading of the bit-slice stimulation control data into the configurable-logic IC 36a or 36b. Segments of dashed lines 154a and 154b extending horizontally across the stimulation-response cycle to the left of timing-signal pulse number three indicate that prior to that timing-signal pulse the stimulus/response cell 72 may be supplying a stimulus to the pin of the digital logic IC either for a logical zero (0) or for a logical (1) data value. A solid line segment 154b extending to the right of timing-signal pulse number three indicates that subsequent to that timing-signal pulse the stimulus/response cell 72 supplies a logical one (1) data value stimulus to the pin of the digital logic IC. The sloping dashed-line segment 178 immediately to the right of timing-signal pulse number three indicates a possible transition of the signal supplied to the trace 42 from a logical zero (0) data value to the logical one (1) data value stored in the bit-stream data-storage flip-flop 164.

Pulse Output Cell without Enable

Figure 7:
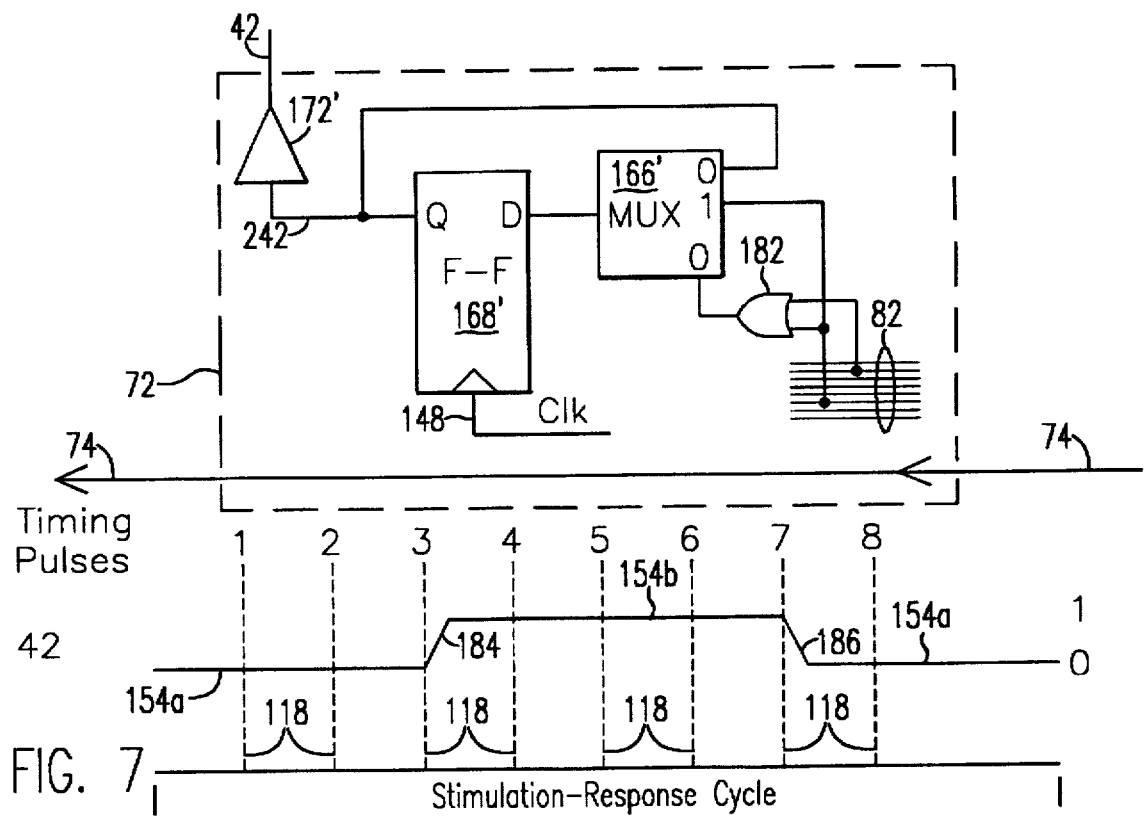
FIG. 7 is a block diagram depicting a pulse stimulus/response cell without enable that may be implemented in a configurable-logic IC such as that depicted in FIG. 2 together with a timing diagram illustrating operation of the stimulus/response cell.

Referring now to FIG. 7, depicted there is a block diagram for a pulse stimulus/response cell 72 without enable that may be implemented in the configurable-logic IC 36a or 36b together with a timing diagram illustrating operation of the pulse stimulus/response cell 72 without enable. The stimulus/response cell 72 depicted in FIG. 7 includes a two data input-terminal and one control input-terminal output-signal multiplexer, an output-signal flip-flop, and an output buffer-amplifier that operate identically to the multiplexer 166, the flip-flop 168 and the buffer amplifier 172 of the simple output stimulus/response cell 72 depicted in FIG. 6. Those elements depicted in the pulse stimulus/response cell 72 without enable of FIG. 7 that are common to the simple output stimulus/response cell 72 depicted in FIG. 6 carry the same reference numeral distinguished by a prime ("'") designation. The pulse stimulus/response cell 72 without enable depicted in FIG. 7 also includes a two input-terminal OR gate 182. The output-signal multiplexer 166', the output-signal flip-flop 168', the output buffer-amplifier 172' and the OR gate 182 are all established by configuration data that is loaded into the configurable-logic IC 36a or 36b during the initialization interval of the simulation process 22 depicted in FIG. 3 between the vertical line 94 and the vertical line 96.

Because the pulse stimulus/response cell 72 depicted in FIG. 7 lacks an enable, operation of the stimulus/response cell 72 is not controlled by stimulation-control data. Therefore, the shift-register links 74 from the immediately preceding stimulus/response cell 72 and to the immediately following stimulus/response cell 72 merely connect with each other within the stimulus/response cell 72.

As depicted in FIG. 7, an output-terminal of the OR gate 182 connects to a "0" control input-terminal of the output-signal multiplexer 166'. Accordingly, assertion of either input-terminal of the OR gate 182 causes the output-signal multiplexer 166' to transmit the signal present at the "1" data input-terminal to the "D" input of the output-signal flip-flop 168'. Subsequently, via a clock signal-line 148 a master clock-pulse for the configurable-logic ICs 36a and 36b is applied to a clock-signal input-terminal of the output-signal flip-flop 168', indicated by a "Λ" within the output-signal flip-flop 168'. Receipt of the master clock-pulse causes the output-signal flip-flop 168' to store the data value then present at the "D" input-terminal, and to transmit that same data value from a "Q" output-terminal of the output-signal flip-flop 168' to the "0" data input-terminal of the output-signal multiplexer 166'.

The "1" data input-terminal of the output-signal multiplexer 166' and a data input-terminal of the OR gate 182 connect to one timing-signal line included in the timing-signal bus 82, the other data input-terminal of the OR gate 182 connects to a different timing-signal line included in the timing-signal bus 82. Occurrence of a timing-signal pulse on the timing-signal line that connects both to an input-terminal of the OR gate 182 and to the "1" data input-terminal of the output-signal multiplexer 166' causes the timing-signal pulse to be stored into the output-signal flip-flop 168'. Conversely, occurrence of a timing-signal pulse on the timing-signal line that connects to only the OR gate 182 resets the output-signal flip-flop 168'. As described above in connection with the stimulus/response cell 72 depicted in FIG. 6, via the trace 42 the output buffer-amplifier 172' transmits the signal present at the "Q" output-terminal of the output-signal flip-flop 168' to a pin of a digital logic IC inserted into the IC socket 34.

The timing diagram included in FIG. 7 depicts stimulation-response cycle operation of the pulse stimulus/response cell 72 without enable when the timing-signal line of the timing-signal bus 82 connected to the "1" data input-terminal of the output-signal multiplexer 166' provides a timing-signal pulse which precedes a timing-signal pulse occurring on the timing-signal line of the timing-signal bus 82 that connects to only a data input-terminal of the OR gate 182. FIG. 7 depicts the third timing-signal pulse being applied both to a data input-terminal of the OR gate 182 and to the "1" data input-terminal of the output-signal multiplexer 166'. Before the third timing-signal pulse represented in FIG. 7 by a vertical line 118, the signal present on the trace 42 connected to the output of the output buffer-amplifier 172' has a logical zero (0) data value as indicated by the portion of the solid line segment 154a to the left of the vertical line 118 representing the third timing-signal pulse. Upon the occurrence of the third timing-signal pulse, the signal present on the trace 42 changes to a logical one (1) data value as indicated by the upward sloping solid line segment 184, and the horizontal solid line segment 154b to the right of the vertical line 118 representing the third timing-signal pulse. FIG. 7 also depicts the seventh timing-signal pulse being applied only to a data input-terminal of the OR gate 182. After the seventh timing-signal pulse occurs, the signal present on the trace 42 changes back to a logical zero (0) data value as indicated by the downward sloping solid line segment 186 and the continuation of the horizontal solid line segment 154a to the left of the vertical line 118 representing the seventh timing-signal pulse.

The pulse stimulus/response cell 72 without enable depicted in FIG. 7 operates during every stimulation-response cycle performed by the hardware pod 32. The pulse produced by the pulse stimulus/response cell 72 without enable can be no shorter than the interval between a pair of immediately successive timing-signal pulses. The pulse can begin with the first timing-signal pulse generated by the timing generator 78, and and end with the last such timing-signal pulse. The pulse produced by the stimulus/response cell 72 depicted in FIG. 7 may be inverted by applying the later timing-signal pulse to the "1" data input-terminal of the output-signal multiplexer 166' rather than the earlier timing-signal pulse. The pulse stimulus/response cell 72 without enable is particularly well suited for supplying a clock signal to a digital logic IC being stimulated by the hardware pod 32.

Pulse Output Cell with Enable

Figure 8:
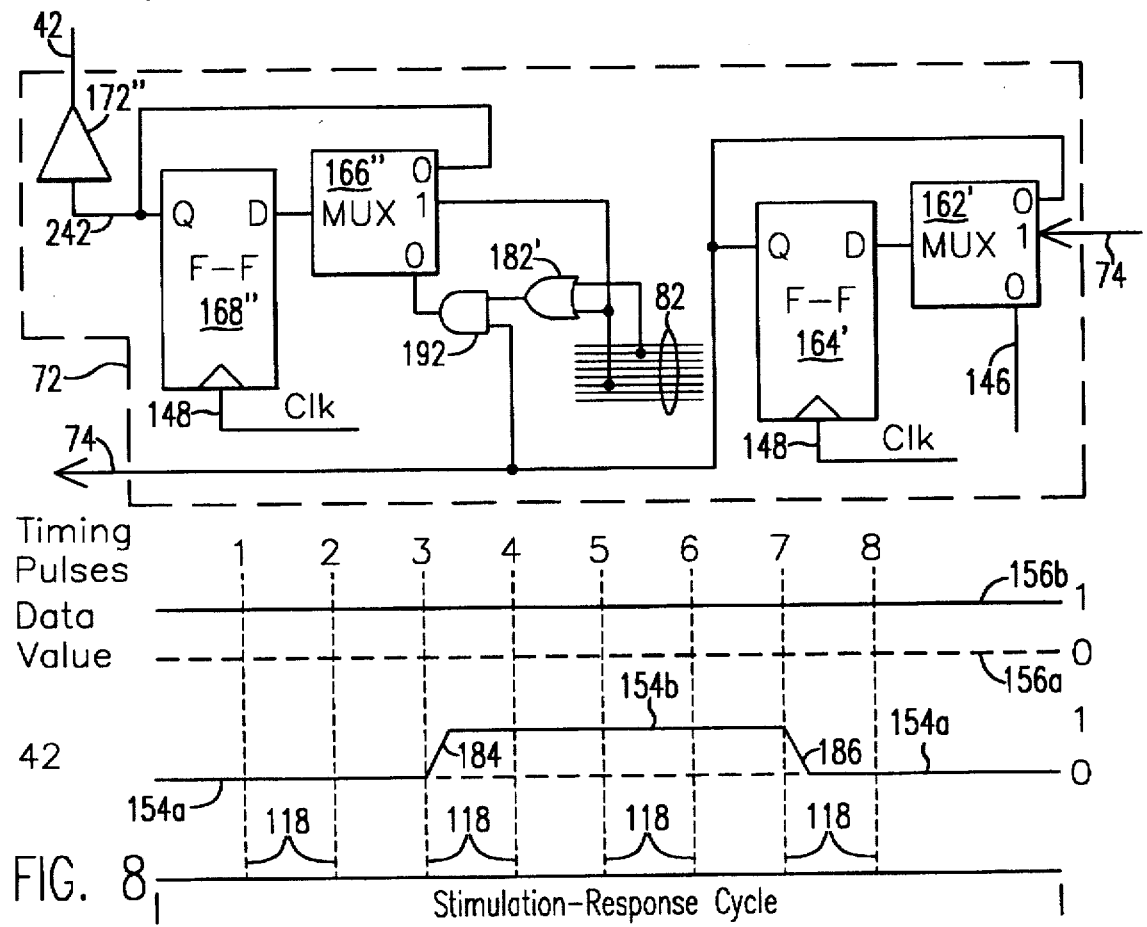
FIG. 8 is a block diagram depicting a pulse stimulus/response cell with enable that may be implemented in a configurable-logic IC such as that depicted in FIG. 2 together with a timing diagram illustrating operation of the stimulus/response cell.

Referring now to FIG. 8, depicted there is a block diagram for a pulse stimulus/response cell 72 with enable that may be implemented in the configurable-logic IC 36a or 36b together with a timing diagram illustrating operation of the pulse stimulus/response cell 72 with enable. The stimulus/ response cell 72 depicted in FIG. 8 includes a two data input-terminal and one control input-terminal shift-register multiplexer and a bit-stream data-storage flip-flop that operate identically to the multiplexer 162 and to the flip-flop 164 of the simple output stimulus/response cell 72 depicted in FIG. 6. Those elements depicted in the pulse stimulus/response cell 72 with enable of FIG. 8 that are common to only the simple output stimulus/response cell 72 depicted in FIG. 6 carry the same reference numeral distinguished by a single prime ("'") designation. The stimulus/response cell 72 depicted in FIG. 8 also includes a two data input-terminal and one control input-terminal output-signal multiplexer, an output-signal flip-flop, and an output buffer-amplifier that operate identically to the multiplexer 166, the flip-flop 168 and the buffer amplifier 172 of the simple output stimulus/response cell 72 depicted in FIG. 6, and of the pulse stimulus/response cell 72 without enable depicted in FIG. 7. Those elements depicted in the pulse stimulus/response cell 72 with enable of FIG. 8 that are common to the simple output stimulus/response cell 72 depicted in FIG. 6 and to the pulse stimulus/response cell 72 without enable depicted in FIG. 7 carry the same reference numeral distinguished by a double prime ("''") designation. The pulse stimulus/response cell 72 with enable also includes a two input-terminal OR gate that operates identically to the OR gate 182 of the pulse stimulus/response cell 72 without enable depicted in FIG. 7. The element depicted in the pulse stimulus/response cell 72 with enable of FIG. 8 that is common to only the simple output stimulus/response cell 72 depicted in FIG. 6 carries the same reference numeral distinguished by a single prime ("'") designation. The pulse stimulus/response cell 72 with enable depicted in FIG. 8 also includes a two input-terminal AND gate 192. The shift-register multiplexer 162', bit-stream data-storage flip-flop 164', output-signal multiplexer 166", output-signal flip-flop 168", output buffer-amplifier 172", OR gate 182' and the AND gate 192 are all established by configuration data that is loaded into the configurable-logic IC 36a or 36b during the initialization interval of the simulation process 22 depicted in FIG. 3 between the vertical line 94 and the vertical line 96.

As described above, before the pulse stimulus/response cell 72 with enable may perform a stimulation-response cycle, the bit-slice stimulation-control data must be loaded into all of the stimulus/response cells 72 included in the configurable-logic ICs 36a and 36b. Loading of the bit-slice stimulation-control data into the shift-register multiplexer 162' and the bit-stream data-storage flip-flop 164' depicted in FIG. 8, and transmission of that stimulation-control data onto the subsequent stimulus/response cell 72 is identical to that described above for the simple output stimulus/response cell 72 depicted in FIG. 6. Also as described above, the output-signal multiplexer 166", output-signal flip-flop 168", and the output buffer-amplifier 172" operate identically to that described above for the pulse stimulus/response cell 72 without enable depicted in FIG. 7.

The connection and signals applied to the data input-terminals of the OR gate 182' in the pulse stimulus/response cell 72 with enable depicted in FIG. 8 are the same as those described above for the pulse stimulus/response cell 72 without enable depicted in FIG. 7. The output terminal of the OR gate 182' connects to a data input-terminal of the AND gate 192. A second data input-terminal of the AND gate 192 connects to the "Q" output terminal of the bit-stream data-storage flip-flop 164'. An output terminal of the AND gate 192 connects to the "0" control input-terminal of the output-signal multiplexer 166". Therefore, the output-signal multi-plexer 166" applies the signal present at the "1" data input-terminal to the "D" input-terminal of the output-signal flip-flop 168" only upon assertion of both inputs signals to the AND gate 192. Consequently, if the shift-register multiplexer 162' and the bit-stream data-storage flip-flop 164' store a logical one (1) data value, application of timing-signal pulses to the respective data input-terminals of the OR gate 182' causes the signal applied to the trace 42 by the output buffer-amplifier 172" to alternate back and forth between a logical one (1) data value and a logical (0) data value.

If during the stimulation-response cycle the bit-stream data-storage flip-flop 164' holds a logical (1) data value, the pulse stimulus/response cell 72 with enable depicted in FIG. 8 operates identically to the pulse stimulus/response cell 72 without enable as illustrated in the timing diagram included in FIG. 7. Conversely, a logical zero (0) present in the bit-stream data-storage flip-flop 164' inhibits operation of the output-signal multiplexer 166", and the pulse stimulus/response cell 72 with enable does not produce a pulse on the trace 42. Accordingly, the absence of a pulse on the trace 42 during operation of the pulse stimulus/response cell 72 with enable having a logical zero (0) present in the bit-stream data-storage flip-flop 164' is illustrated in the timing diagram of FIG. 8 by a dashed line segment 154a that extends between the third and seventh timing-signal pulses represented in FIG. 8 by vertical line 118s. Similar to the pulse stimulus/response cell 72 without enable, applying the later timing-signal pulse to the "1" data input-terminal of the output-signal multiplexer 166' rather than the earlier timing-signal pulse inverts the pulse applied to the trace 42 by the output buffer-amplifier 172 from that illustrated in the timing diagram of FIG. 8.

Bidirectional Cell

Figure 9:
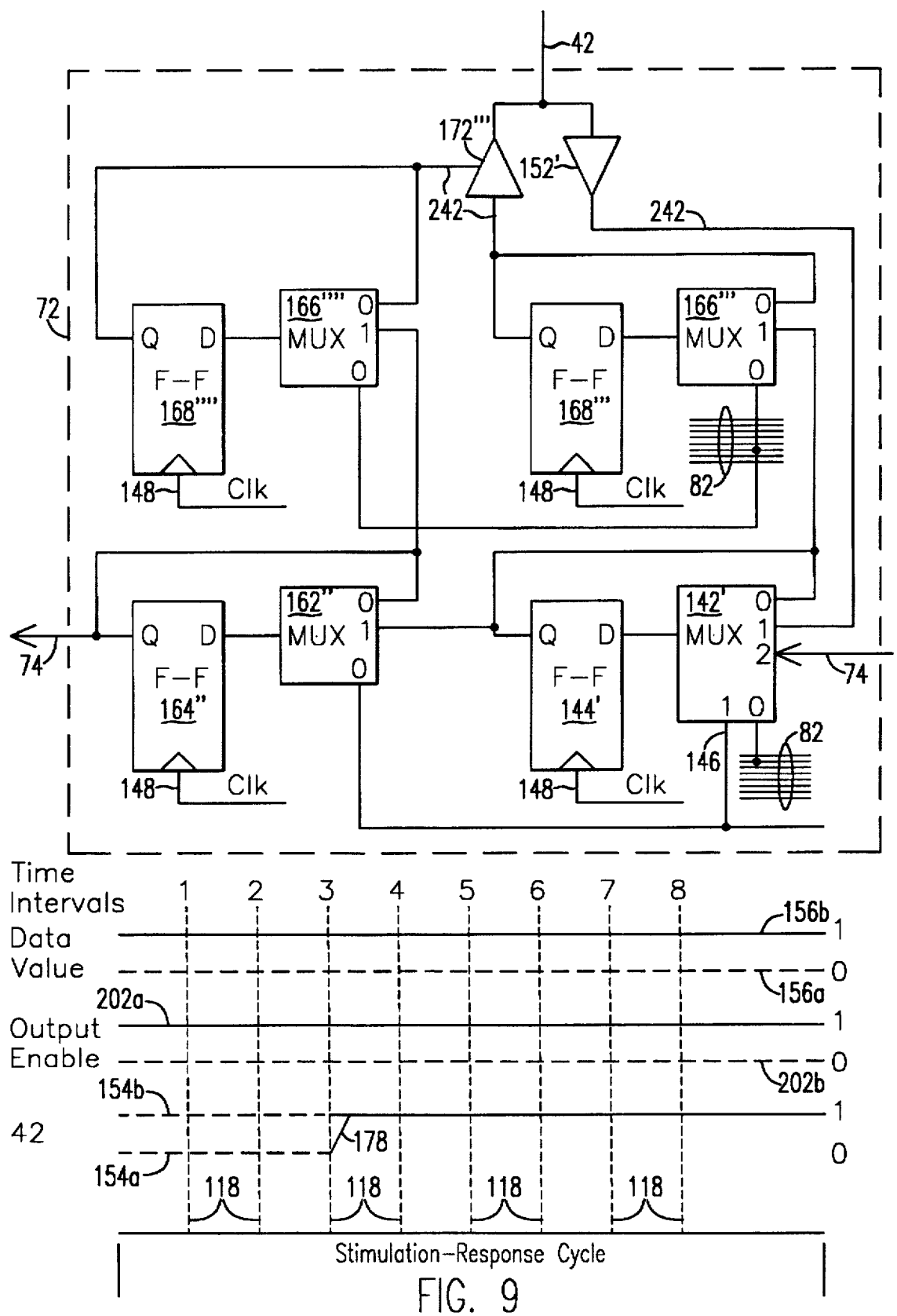
FIG. 9 is a block diagram depicting a simple bidirectional stimulus/response cell that may be implemented in a configurable-logic IC such as that depicted in FIG. 2 together with a timing diagram illustrating operation of the stimulus/response cell.

Referring now to FIG. 9, depicted there is a block diagram for a bidirectional stimulus/response cell 72 that may be implemented in the configurable-logic IC 36a or 36b together with a timing diagram illustrating operation of the bidirectional stimulus/response cell 72. The stimulus/response cell 72 depicted in FIG. 9 includes a three data input-terminal, two control input-terminal shift-register multiplexer, a bit-stream data-storage flip-flop, and an input buffer-amplifier that operate identically to the shift-register multiplexer 142, the bit-stream data-storage flip-flop 144 and the input buffer-amplifier 152 depicted in FIG. 5. Those elements depicted in the bidirectional stimulus/response cell 72 of FIG. 9 that are common to the simple input stimulus/response cell 72 depicted in FIG. 5 carry the same reference numeral distinguished by a single prime ("'") designation. The stimulus/response cell 72 depicted in FIG. 9 includes a two data input-terminal and one control input-terminal shift-register multiplexer and a bit-stream data-storage flip-flop that operate identically to the multiplexer 162 and to the flip-flop 164 of the simple output stimulus/response cell 72 depicted in FIG. 6, and of the pulse stimulus/response cell 72 with enable depicted in FIG. 8. Those elements depicted in the bidirectional stimulus/response cell 72 of FIG. 9 that are common to the simple output stimulus/response cell 72 depicted in FIG. 6, and the pulse stimulus/response cell 72 with enable depicted in FIG. 8 carry the same reference numeral distinguished by a double prime ("''") designation.

As described above, before the bidirectional stimulus/response cell 72 may perform a stimulation-response cycle, the bit-slice stimulation-control data must be loaded into all of the stimulus/response cells 72 included in the configurable-logic ICs 36a and 36b. Loading bit-slice stimulation-control data into the shift-register multiplexer 142' and bit-stream data-storage flip-flop 144' depicted in FIG. 9, is identical to that described above for the simple input stimulus/response cell 72 depicted in FIG. 5 except that the "Q" output terminal of the bit-stream data-storage flip-flop 144' does not connect to a shift-register link 74 that couples the bidirectional stimulus/response cell 72 to the subsequent stimulus/response cell 72. Similarly, loading bit-slice stimulation control-data into the shift-register multiplexer 162" and the bit-stream data-storage flip-flop 164" depicted in FIG. 9, and transmission of that stimulation-control data onto the subsequent stimulus/response cell 72 is identical to that described above for the simple output stimulus/response cell 72 depicted in FIG. 6 except that the stored stimulation control-data comes from the bit-stream data-storage flip-flop 164' rather than from the shift-register link 74 connecting the bidirectional stimulus/response cell 72 to the immediately preceding stimulus/response cell 72.

The stimulus/response cell 72 depicted in FIG. 9 also includes two pairs of a two data input-terminal and one control input-terminal output-signal multiplexer and an output-signal flip-flop. Each pair of output-signal multiplexer and output-signal flip-flop operate identically to the multiplexer 166 and the flip-flop 168 of the simple output stimulus/response cell 72 depicted in FIG. 6, the pulse stimulus/response cell 72 without enable depicted in FIG. 7, and the pulse stimulus/response cell 72 with enable depicted in FIG. 8. A first pair of those elements depicted in the bidirectional stimulus/response cell 72 with enable of FIG. 9 that are common to the simple output stimulus/response cell 72 depicted in FIG. 6, to the pulse stimulus/response cell 72 without enable depicted in FIG. 7, and to the pulse stimulus/response cell 72 with enable depicted in FIG. 8 carry the same reference numeral distinguished by a triple prime ("'''") designation, while a second pair of those elements carry the same reference numeral distinguished by a quadruple prime ("''''") designation. The bidirectional stimulus/response cell 72 depicted in FIG. 9 also includes an output buffer-amplifier that operates similarly to the buffer amplifier 172 of the simple output stimulus/response cell 72 depicted in FIG. 6, the pulse stimulus/response cell 72 without enable depicted in FIG. 7, and the pulse stimulus/response cell 72 with enable depicted in FIG. 8. The output buffer-amplifier depicted in the bidirectional stimulus/response cell 72 of FIG. 9 carries the same reference numeral distinguished by a triple prime ("'''") designation.

The shift-register multiplexer 142', bit-stream data-storage flip-flop 144', input buffer-amplifier 152', shift-register multiplexer 162", bit-stream data-storage flip-flop 164", output-signal multiplexer 166''', output-signal flip-flop 168''', output-signal multiplexer 166'''', output-signal flip-flop 168'''', and the output buffer-amplifier 172''' are all established by configuration data that is loaded into the configurable-logic IC 36a or 36b during the initialization interval of the simulation process 22 depicted in FIG. 3 between the vertical line 94 and the vertical line 96.

While the "Q" output-terminal of the output-signal flip-flop 168'''' included in the bidirectional stimulus/response cell 72 depicted in FIG. 9 connects to the output buffer-amplifier 172''', that output-terminal does not connect to an input-terminal of the output buffer-amplifier 172''' like the "Q" output-terminal of the output-signal flip-flop 168'''. Rather the "Q" output-terminal of the output-signal flip-flop 168'''' connects to an enable input-terminal of the output buffer-amplifier 172'''. Accordingly, assertion of the signal transmitted from the "Q" output terminal of the output-signal flip-flop 168'''' to the enable input-terminal of the output buffer-amplifier 172''' activates the output buffer-amplifier 172''' for transmitting either a logical zero (0) or a logical one (1) data value to the trace 42, the transmitted data value corresponding with the data value supplied to the data input-terminal of the output buffer-amplifier 172''' from the "Q" output-terminal of the output-signal flip-flop 168'''. Conversely, negation of the signal transmitted from the "Q" output terminal of the output-signal flip-flop 168'''' to the enable input-terminal of the output buffer-amplifier 172''' causes the output buffer-amplifier 172''' to electrically decouple from the trace 42, thereby allowing operation of other electronic circuits that are coupled to the trace 42 to determine the value of the signal present on the trace 42.

The bidirectional stimulus/response cell 72 depicted in FIG. 9 may either transmit an output signal to the trace 42 during a stimulation-response cycle, or receive an input signal from the trace 42 during a stimulation-response cycle. However, during a single stimulation-response cycle the stimulus/response cell 72 depicted in FIG. 9 cannot both transmit an output signal to and receive an input signal from the trace 42. Accordingly, if the bidirectional stimulus/response cell 72 is configured for receiving an input signal from the trace 42 during the stimulation-response cycle, the input buffer-amplifier 152', the shift-register multiplexer 142' and the bit-stream data-storage flip-flop 144' operate the same as described above for the simple input stimulus/response cell 72 depicted in FIG. 5. Conversely, if the bidirectional stimulus/response cell 72 is configured for transmitting an output signal to the trace 42 during the stimulation-response cycle, the output-signal multiplexer 166''' and the output-signal flip-flop 168''' operate the same as described above for the simple output stimulus/response cell 72 depicted in FIG. 6 except that the bit-stream data-storage flip-flop 144' depicted in FIG. 9 supplies the logical data value to the "1" data input-terminal of the output-signal multiplexer 166''' rather than the bit-stream data-storage flip-flop 164 depicted in FIG. 6.

The data value stored in the shift-register multiplexer 162" and the bit-stream data-storage flip-flop 164" configures the bidirectional stimulus/response cell 72 either to receive a data value from the trace 42 or to transmit a data value to the trace 42. If the shift-register multiplexer 162" and the bit-stream data-storage flip-flop 164" store a logical one (1) data value as depicted by a horizontal solid line 202a in the timing diagram included in FIG. 9, then the output buffer-amplifier 172''' is enabled for transmitting the data value stored in the shift-register multiplexer 142' and the bit-stream data-storage flip-flop 144' to the trace 42 when a timing-signal pulse occurs on the timing-signal line of the timing-signal bus 82 that connects both to "0" control signal inputs of the output-signal multiplexer 166''' and 166''''. Conversely, if the shift-register multiplexer 162" and the bit-stream data-storage flip-flop 164" store a logical zero (0) data value as depicted by a horizontal dashed line 202b in the timing diagram included in FIG. 9, then the output buffer-amplifier 172''' is disabled from transmitting a signal to the trace 42, and, when a timing-signal pulse occurs on the timing-signal line of the timing-signal bus 82 that connects to "0" control signal inputs of the shift-register multiplexer 142', the shift-register multiplexer 142' and the bit-stream data-storage flip-flop 144' store the data value then present on the trace 42. In this latter case operation of the bidirectional stimulus/response cell 72 is identical to that depicted in the timing diagram of FIG. 5.

Other Types of Stimulus/Response Cells 72

Functionally, the bidirectional stimulus/response cell 72 depicted in FIG. 9 is equivalent to a simple input stimulus/response cell 72 combined with a tri-state output stimulus/ response cell 72. Accordingly, elimination of the input buffer-amplifier 152' from the block diagram of FIG. 9, replacement of the three data input-terminal shift-register multiplexer 142' with a two data input-terminal multiplexer such as the shift-register multiplexer 162", removing any connection between the timing-signal bus 82 and the shift-register multiplexer 162" that replaces the shift-register multiplexer 142', and connecting the shift-pulse signal-line 146 to the "0" control input-terminal of the shift-register multiplexer 162" that replaces the shift-register multiplexer 142' yields a tri-state output stimulus/response cell 72.

Similarly, a simple input stimulus/response cell 72 that receives two responses during each stimulation-response cycle may be readily assembled merely by cascading two pairs of the shift-register multiplexer 142 and the bit-stream data-storage flip-flop 144 depicted in FIG. 5 for the simple input stimulus/response cell 72 depicted there. Analogously, a two transitions per stimulation-response cycle simple output stimulus/response cell 72 may be readily assembled by cascading two pairs of the shift-register multiplexer 162 and bit-stream data-storage flip-flop 164 depicted in FIG. 6, and replacing the two data input-terminal, one control input-terminal output-signal multiplexer 166 depicted in FIG. 6 with a three data input-terminal, two control input-terminal multiplexer similar to that depicted in FIG. 5 for the shift-register multiplexer 142.

It is readily apparent that additional types of stimulus/response cells 72 having functionalities which augment, or which differ from those described thus far may prove helpful in stimulating a digital logic IC plugged into the IC socket 34, or in emulating a digital logic IC. A description, set forth below, of how to implement, with configuration data loaded into the configurable-logic ICs 36a and 36b, the various stimulus/response cells 72 that have been described thus far permits those skilled in the relevant art to use a digital logic simulation/emulation system 20 in accordance with the present invention that employs such alternative stimulus/response cells 72.

Bit-Slice Stimulation-Control Data

From the preceding description of the various different types of stimulus/response cells 72, it is readily apparent that different types of stimulus/response cells 72 may require zero (0), one (1), two (2), three (3), or more bits of data in the bit-slice stimulation-control data. Consequently, the length of the bit-slice stimulation-control data, and significance of individual bits within the bit-slice stimulation-control data cannot be established or ascertained without knowing the type and sequence of stimulus/response cells 72 being connected into a shift-register by the shift-register link 74s.

Logic Configuration Library 86

FIG. 10 is a diagram depicting organization and structure of files stored in the logic-configuration library 86 depicted in FIG. 1. The logic-configuration library 86 may include numerous file-sets 212, such as file-sets 212a through 212e illustrated in FIG. 10. Each file-set 212 contains the data required for operating a particular digital logic IC using the digital logic simulation/emulation system 20. As depicted in FIG. 10 for the file-set 212c, each individual file-set 212 stores simulation modules 214 required for the simulation process 22 together with a number of FPGA configuration data files 216a through 216g. The simulation modules 214 include the shell module which must be incorporated into the simulation process 22, the server process 62, and a data file used by the computer program executed by the CPU 44. The number of FPGA configuration data files 216a through 216g stored in a file-set 212 equals the number of configurable-logic ICs included in the hardware pod 32.

As indicated by an arrow 222 in FIG. 1, the files present in the logic-configuration library 86 are prepared by a configurable-logic specification process 224 that is executed by the digital computer 24. The configurable-logic specification process 224 preferably includes a graphic user interface ("GUI") computer program 226 which an operator uses in specifying characteristics of a digital logic IC.

GUI 226

Figure 11:
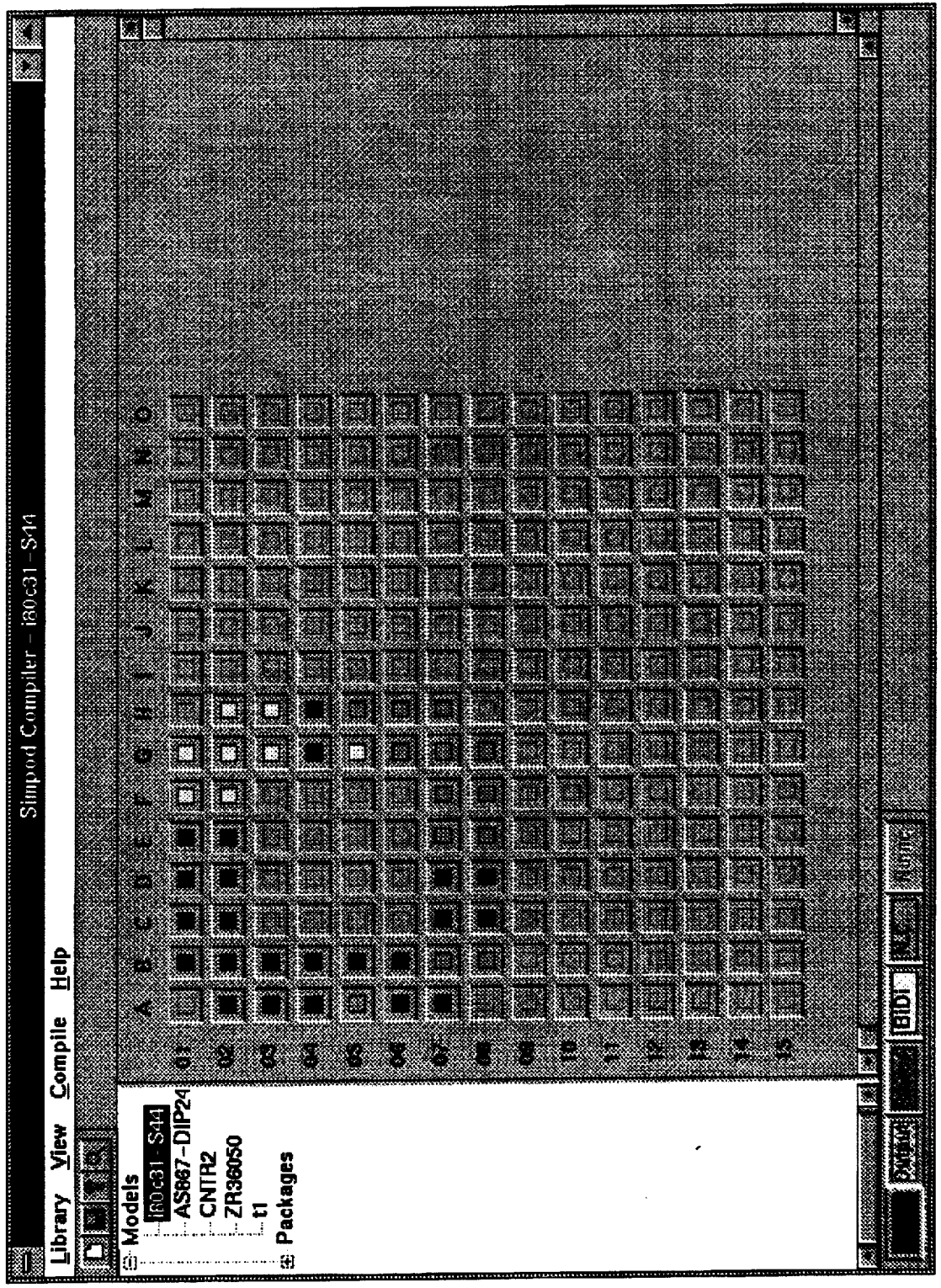
FIG. 11 depicts a screen display presented by a graphic user interface ("GUI") computer program which an operator uses in specifying, for use by the digital logic simulation/emulation system, characteristics of an IC to be received into the socket of the hardware pod depicted in FIG. 1.

As illustrated in FIG. 11, the preferred GUI computer program 226 presents an operator with a screen display that graphically represents the IC socket 34. In specifying a file-set 212 to be included in the logic-configuration library 86, the screen display depicted in FIG. 11 permits an operator to select, from a hierarchical table provided along the left hand side of FIG. 11, a physical package for the digital logic IC to be inserted into the IC socket 34. Having selected a physical package for the digital logic IC, the operator then specifies a name for the file-set 212 which the GUI computer program 226 then adds to a roster of models for different types of digital logic ICs listed in the hierarchical table along the left hand side of FIG. 11.

Having specified a package for and assigned a name to the model, the operator then uses the GUI computer program 226 to specify electrical characteristics for various pins of the digital logic IC that are to be inserted into the IC pin-receptacles 38 of the IC socket 34. Using the screen display depicted in FIG. 11, the operator specifies the type of stimulus/response cell 72 to be coupled by a trace 42 to a IC pin-receptacle 38 by first selecting one button from a row of buttons presented in the lower left-hand corner of the screen display depicted in FIG. 11. Having specified the type of stimulus/response cell 72, the operator then selects a particular IC pin-receptacle 38 from an array of IC pin-receptacles 38 graphically represented in FIG. 11 by a square matrix of boxes. Upon operator selection of a pin from the square matrix of boxes, the GUI presents the operator with an appropriate one of the screen displays depicted in FIGS. 12 through 15.

Figure 12:
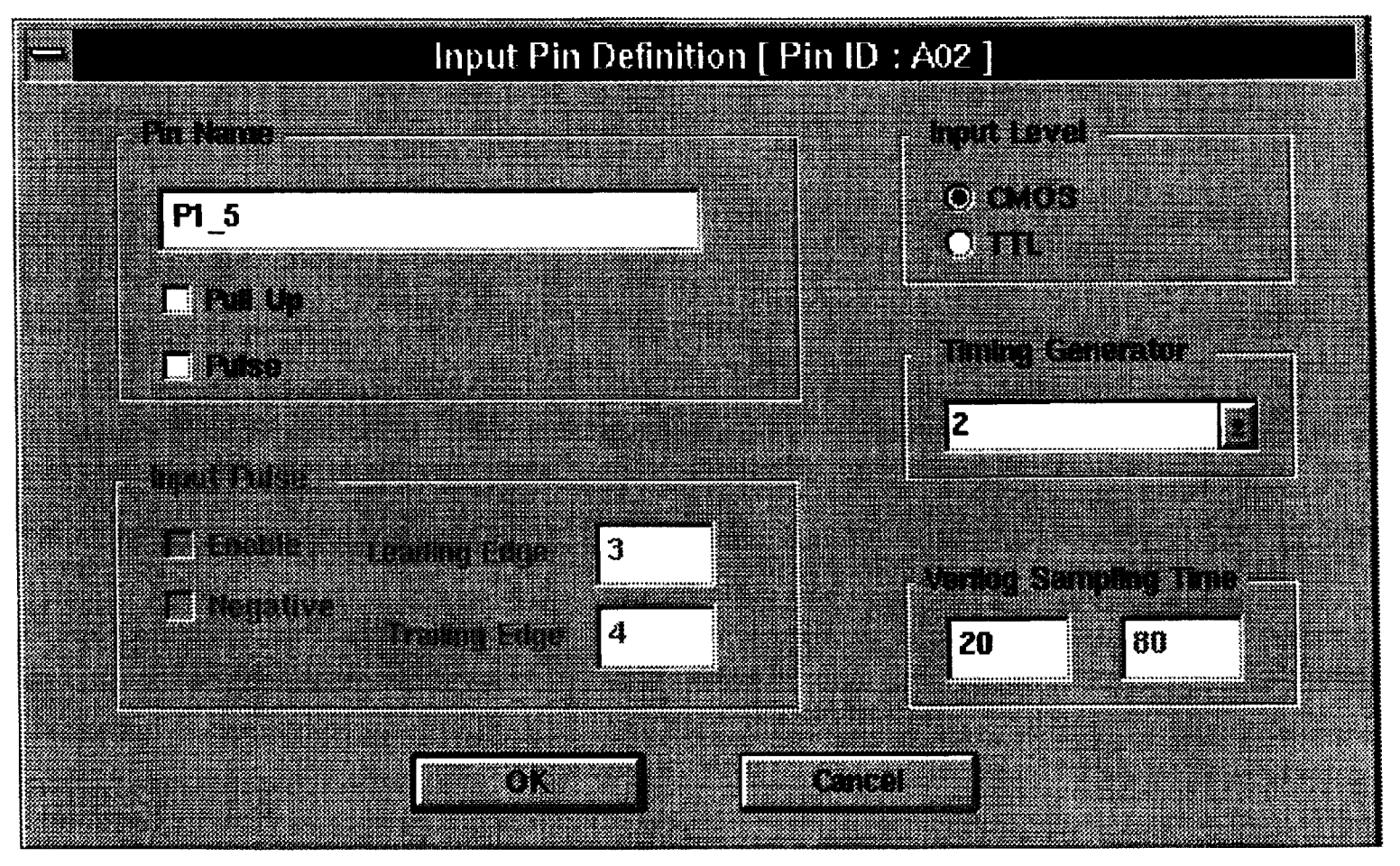
Figure 13:
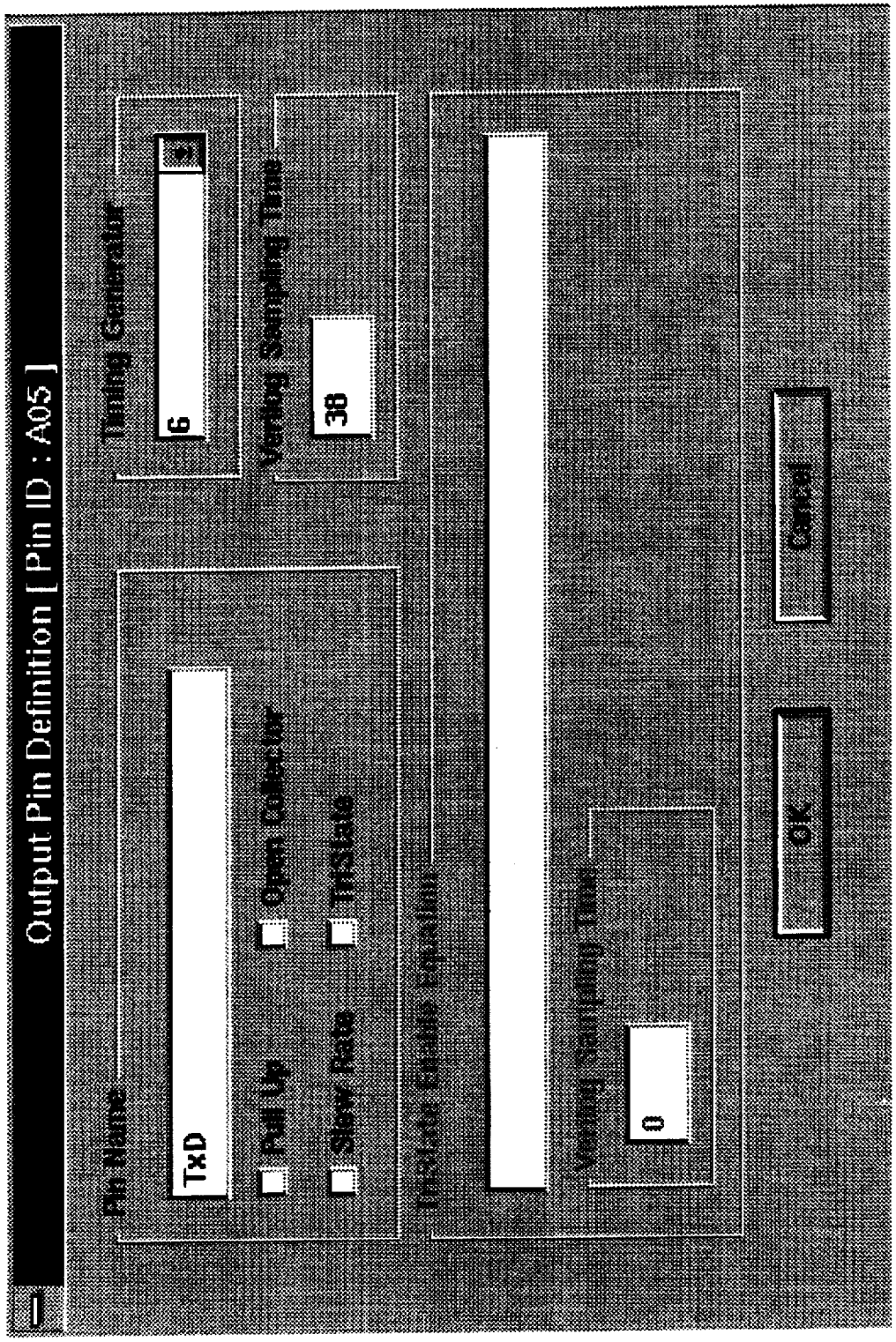
FIG. 13 depicts a screen display that, upon operator selection from the display depicted in FIG. 11, the GUI computer program presents to the operator for specifying characteristics of an output pin of the of the digital logic IC.
Figure 14:
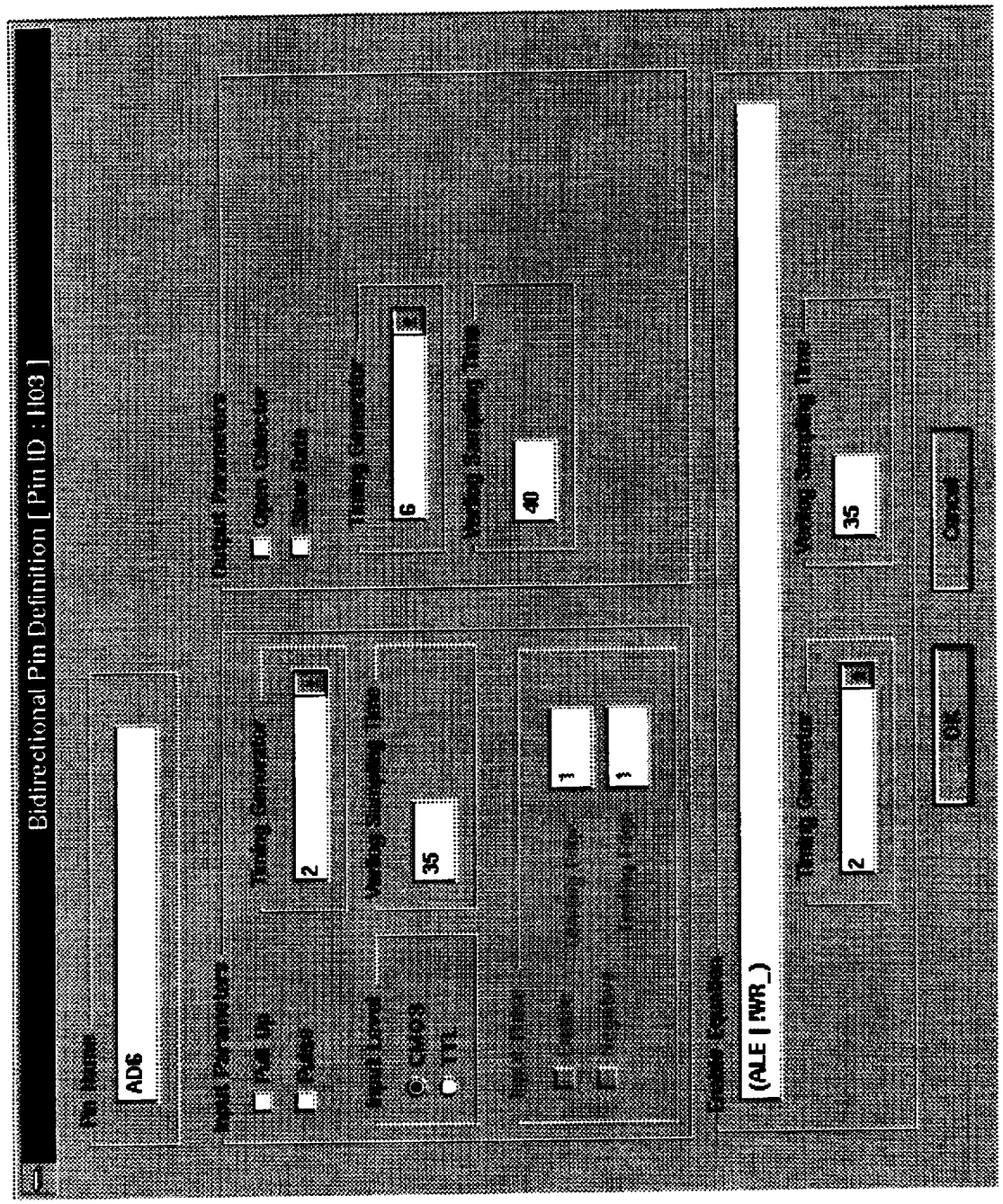
FIG. 14 depicts a screen display that, upon operator selection from the display depicted in FIG. 11, the GUI computer program presents to the operator for specifying characteristics of a bidirectional pin of the of the digital logic IC.
Figure 15:
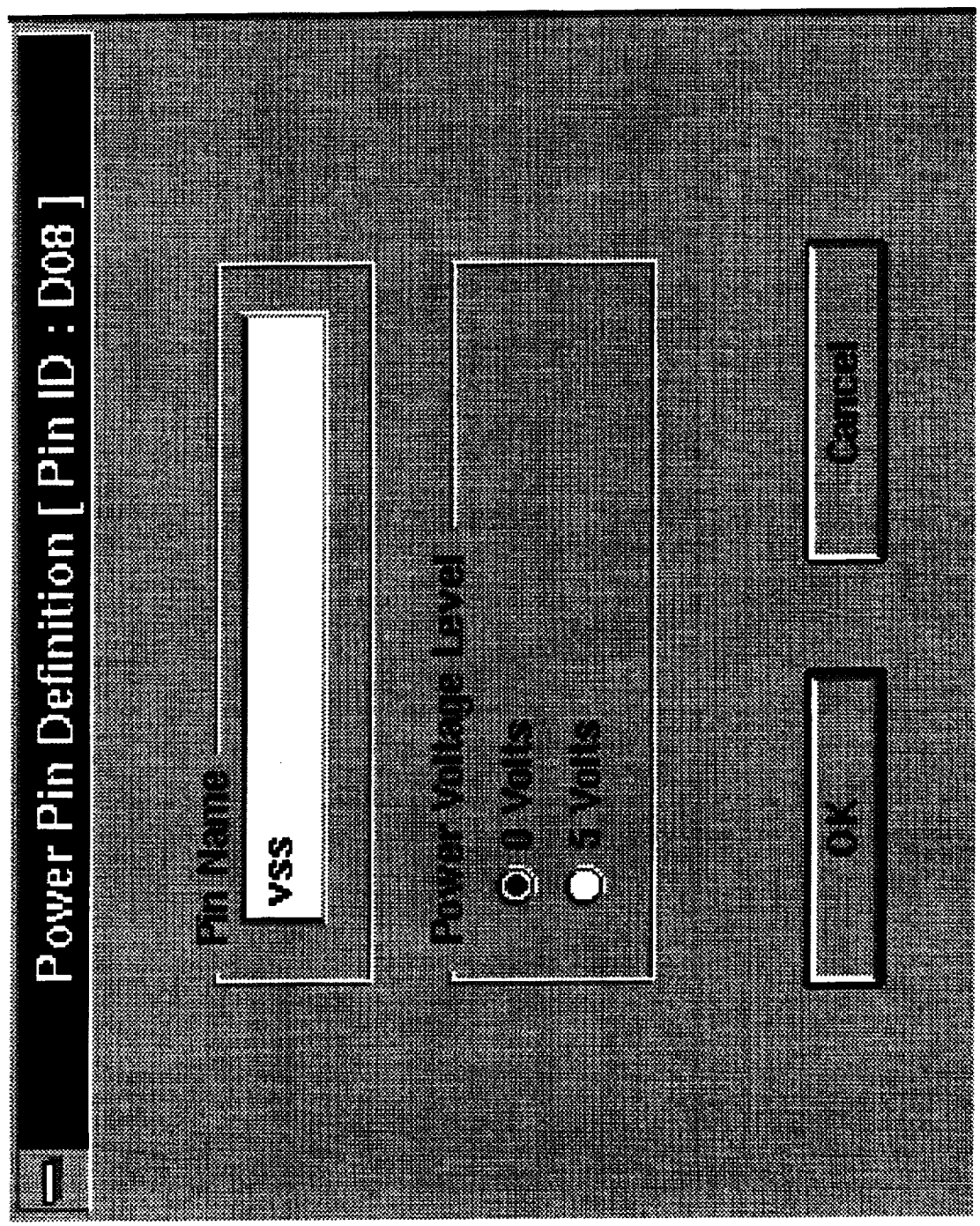
FIG. 15 depicts a screen display that, upon operator selection from the display depicted in FIG. 11, the GUI computer program presents to the operator for specifying characteristics of an electrical power pin of the of the digital logic IC.

FIG. 12, presented to an operator by the GUI computer program 226, depicts a screen display that permits specifying characteristics for an input pin of the digital logic IC that is coupled by a trace 42 to an output stimulus/response cell 72 that is included in either the configurable-logic IC 36a or 36b. Alternatively, the screen display of FIG. 12 permits specifying inclusion of a pulse stimulus/response cell 72 in either the configurable-logic IC 36a or 36b. FIG. 13, presented to an operator by the GUI computer program 226, depicts a screen display that permits specifying characteristics for an output pin of the digital logic IC that is coupled by a trace 42 to an input stimulus/response cell 72 that is included in either the configurable-logic IC 36a or 36b. FIG. 14, presented to an operator by the GUI computer program 226, depicts a screen display that permits specifying characteristics for a bidirectional pin of the digital logic IC that is coupled by a trace 42 to a bidirectional stimulus/response cell 72 that is included in either the configurable-logic IC 36a or 36b. Alternatively, the screen display of FIG. 14 permits specifying inclusion of a pulse stimulus/response cell 72 in either the configurable-logic IC 36a or 36b. FIG. 15, presented to an operator by the GUI computer program 226, depicts a screen display that permits an operator to specify characteristics for a power or ground pin of the digital logic IC which is coupled by a trace 42 to an input stimulus/response cell 72 that is included in either the configurable-logic IC 36a or 36b.

As depicted in FIGS. 12 through 14, the screen displays presented by the GUI computer program 226 permit specifying a time interval within the stimulation-response cycle during which the selected stimulus/response cell is to provide a stimulus signal to the digital logic IC, and/or receive a response from the digital logic IC. In addition to specifying various characteristics of the stimulus/response cells 72 that are described above in connection with FIGS. 5 through 9, the screen displays depicted in FIGS. 12 through 15 also permit an operator to specify additional characteristics for stimulus/response cells 72 which the configurable-logic ICs 36a and 36b intrinsically permit specifying in the configuration data. After an operator has specified characteristics for the pins of the digital logic IC using the GUI computer program 226, a computer program included in the configurable-logic specification process 224 processes the data so specified to compile both the simulation modules 214, and the FPGA configuration data files 216a through 216g. The configurable-logic specification process 224 then stores the simulation modules 214 and the FPGA configuration data files 216a through 216g into a file-set 212 in the logic-configuration library 86.

Compiling Configuration Data Files 216

As described previously, the Atmel AT6005 FPGA provides a symmetric matrix of small, yet powerful configurable digital logic cells, such as that depicted on page 2–6 of Atmel's "Configurable Logic Design and Application Book." The matrix of configurable digital logic cells connects to a flexible bussing network. The FPGA's symmetric matrix is surrounded by programmable I/O cells that connect to pins of the FPGA IC. The conventional method used to generate data for configuring a FPGA, such as the preferred AT6005, is a "place and route" computer program.

A conventional "place and route" computer program generally accepts as input data a file which specifies digital logic functions to be implemented by logically interconnecting the configurable-logic cells, together with additional data specifying other characteristics, for example speed, that must be met if certain of the digital logic functions are to operate properly. The conventional "place and route" computer program then, somewhat arbitrarily, assigns the specified digital logic functions to various configurable-logic cells of the FPGA. Having assigned the digital logic functions to various configurable-logic cells, the conventional "place and route" computer program then iteratively tests random variations of the configurable-logic cell assignment, accepting a variation if it improves the quality of the configurable-logic cell routing. By testing a large number of random variations and accepting those which improve the quality of the configurable-logic cell routing while rejecting those with degrade the routing, the conventional "place and route" computer program seeks to develop an optimum configuration of the FPGA's configurable-logic cells implementing the specified digital logic function.

Because conventional "place and route" computer programs operate in the preceding manner, generally users of such programs obtain configuration data for a FPGA by runing the program overnight. However, it is clearly impractical to use a technique as cumbersome as the conventional "place and route" process for a system such as the digital logic simulation/emulation system 20 if a dozen, or even one-half dozen, FPGA's must be configured before the digital logic simulation/emulation system 20 can perform a simulation or emulation. Accordingly, the preferred embodiment of the present invention employs an alternative technique for swiftly determining, within a matter of minutes, FPGA configuration data that establishes the stimulus/response cells 72, shift-register links 74, state machine 76, timing generator 78 and timing-signal bus 82 included in the configurable-logic ICs 36a and 36b.

Instead of using a conventional "place and route" computer program to determine configuration data for the configurable-logic ICs 36a and 36b, the digital logic simulation/emulation system 20 includes a configurable-logic cell-library 232, depicted in FIG. 1. The configurable-logic cell-library 232 stores, among other data, a set of configuration data specifying, for each different type of stimulus/response cell 72, a pre-established interconnection of several configurable-logic cells included in the configurable-logic ICs 36a and 36b. The configurable-logic cell-library 232 also stores, as a separate file, a list of the different types of stimulus/response cells 72 for which configuration data exists in the configurable-logic cell-library 232. The list of different types of stimulus/response cells 72 for which configuration data exists in the configurable-logic cell-library 232 facilitates adding new types of stimulus/response cells 72 to those already specified by the configurable-logic cell-library 232. As indicated by the arrow 234, the configurable-logic specification process 224 retrieves data, including configuration data, from the configurable-logic cell-library 232 for use in specifying and in compiling the configuration data to be loaded into the configurable-logic ICs 36a and 36b.

Upon loading a set of configuration data for a particular type of stimulus/response cell 72 retrieved from the configurable-logic cell-library 232 into the configurable-logic IC 36a or 36b, the pre-established configuration data interconnects several configurable-logic cells 236, illustrated in FIG. 16, into a digital logic circuit that performs the digital logic functions specified for that stimulus/response cell 72. The configurable-logic cell-library 232 also stores pre-established sets of configuration data that specify interconnections for configurable-logic cells 236 which, upon being loaded into the configurable-logic IC 36a or 36b, establish the state machine 76, the timing generator 78 and the timing-signal bus 82. All of the pre-established sets of configuration data stored in the configurable-logic cell-library 232 are arranged so the configuration data for the entire configurable-logic IC 36a or 36b may be determined merely by assigning, to specific locations throughout the configurable-logic IC 36a or 36b, the various sets of configuration data retrieved from the configurable-logic cell-library 232.

The pre-established configuration data for the several different types of stimulus/response cells 72 is arranged such that juxtaposing configuration data for a pair of stimulus/response cells 72, regardless of their type, establishes a signal path 238 between the pair of juxtaposed stimulus/response cells 72 that includes both the shift-register link 74 and the shift-pulse signal-line 146. The shift-pulse signal-line 146 in each pair of juxtaposed stimulus/response cells 72 provides a signal path for transmitting the shift-pulse data signal through both stimulus/response cells 72 to a stimulus/response cell 72 juxtaposed on one side of the pair of stimulus/response cells 72. As described previously, the shift-register link 74 included in the signal path 238 interconnects each pair of juxtaposed stimulus/response cells 72 into a shift-register.

As indicated in FIG. 16, each stimulus/response cell 72 occupies a rectangular array of AT6005 configurable-logic cells 236 that is two (2) cells wide by eight (8) cells high. Three I/O lines 242 connect the 2×8 array of configurable-logic cells 236 directly to a programmable input cell 244, and to a programmable output cell 246. The programmable input cell 244 and the programmable output cell 246 respectively implement the input buffer-amplifier 152 and the output buffer-amplifier 172 depicted in FIGS. 5 through 9.

Because at least one configurable-logic cell 236 included in each of the stimulus/response cells 72 must connect to the timing-signal bus 82, stimulus/response cells 72 are omitted from several of the pins that are located in any corner of the AT6005's symmetric matrix. In general, eight (8) pins in each corner of the AT6005 do not connect to the traces 42.

FIG. 16 also illustrates configuration of the configurable-logic IC 36a or 36b for a trace 42 which does not connect to a pin of a digital logic IC. If a trace 42 is not coupled to a stimulus/response cell 72, the configuration data connects the shift-register link 74 and shift-pulse signal-line 146 for one stimulus/response cell 72 to the shift-register link 74 and shift-pulse signal-line 146 of the next stimulus/response cell 72 via the bussing network intrinsically included in the AT6005. An Atmel publication entitled "AT6005 Bit Stream Specification," that is incorporated herein by reference, describes formats for the configuration data stored into the FPGA configuration data files 216a through 216g.

Figure 17:
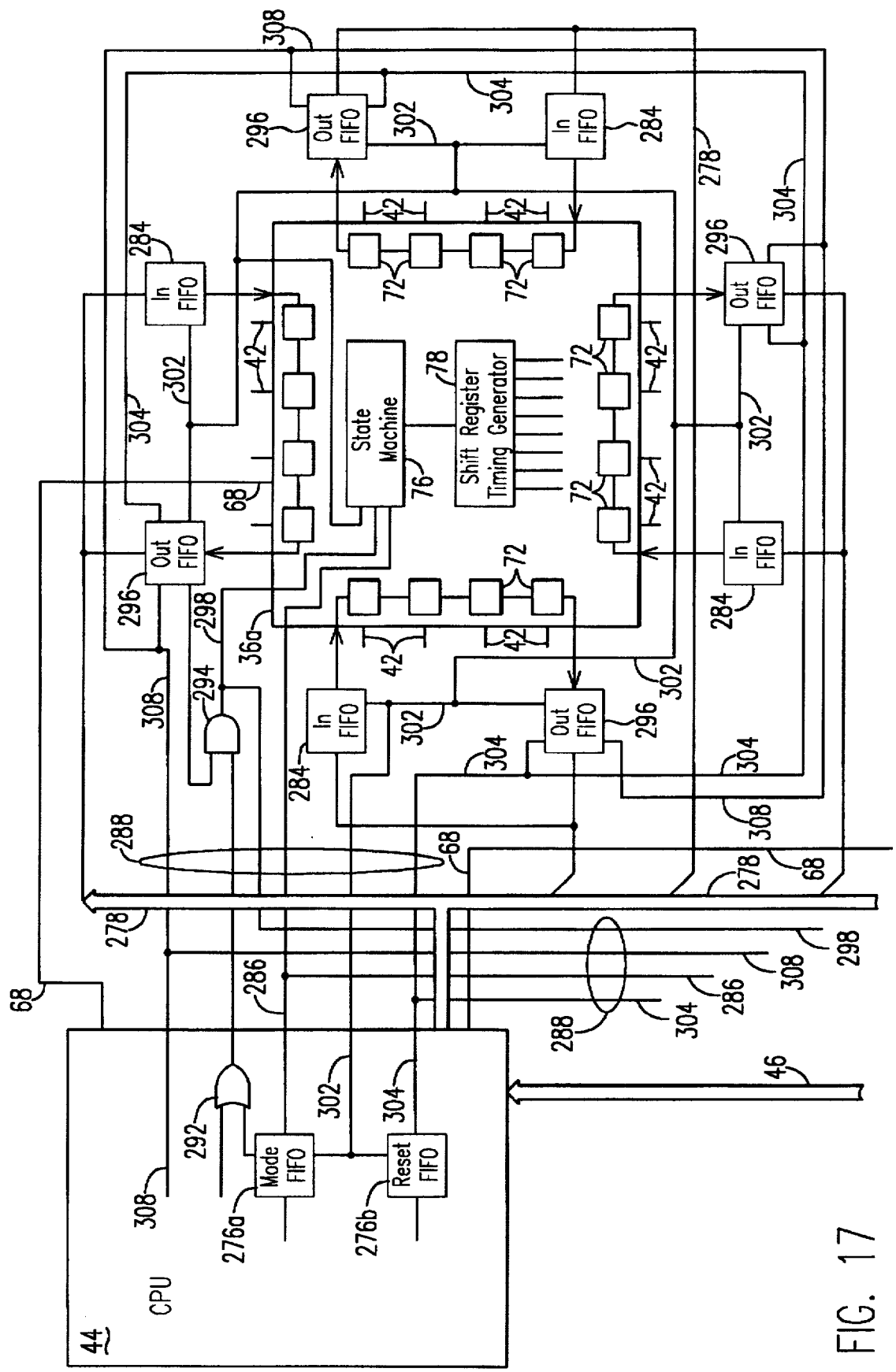
FIG. 17 is a block diagram depicting a preferred configuration for the configurable-logic ICs in which there are four (4) separate shift-registers, each shift-register receiving stimulation-control data from an input-FIFO, and transmitting response data to an output-FIFO.

For pedagogical reasons, thus far the description of the configurable-logic ICs 36a and 36b has been simplified, somewhat, from the preferred embodiment. Specifically, rather than being organized with a single, unitary shift-register that extends continuously around the periphery of the configurable-logic ICs 36a and 36b, the configuration data loaded into the configurable-logic ICs 36a and 36b actually establishes four (4) independent shift-registers, one such shift-register being positioned along each edge of the configurable-logic ICs 36a and 36b as illustrated in FIG. 17. The assignment of stimulus/response cells 72 to four separate shift-registers both simplifies assignment of the stimulus/response cells 72 to configurable-logic cells 236 of the configurable-logic ICs 36a and 36b, and also reduces the time required to load the bit-slice stimulation-control data into and retrieve the bit-slice response data from the configurable-logic ICs 36a and 36b. Furthermore, since several of the pins located in each corner of the AT6005's symmetric matrix are not used for the stimulus/response cells 72, some of such pins are used as an input to and output from each shift-register, and for coupling control signals into and from the state machine 76.

The accompanying Microfiche Appendix I sets forth both the GUI computer program 226 and the computer program which compiles data specified using the GUI computer program 226 to assemble a file-set 212. In compiling the simulation modules 214 and FPGA configuration data files 216a through 216g, the configurable-logic specification process 224 uses a file, included in the configurable-logic cell-library 232, which provides a software description of the hardware pod 32. Reference to a software description of the hardware pod 32 by the configurable-logic specification process 224 permits readily adapting the digital logic simulation/emulation system 20 to operate with hardware pods 32 having differing structures.

Loading Stimulation-Control Data and Retrieving Response Data

Figure 18A:
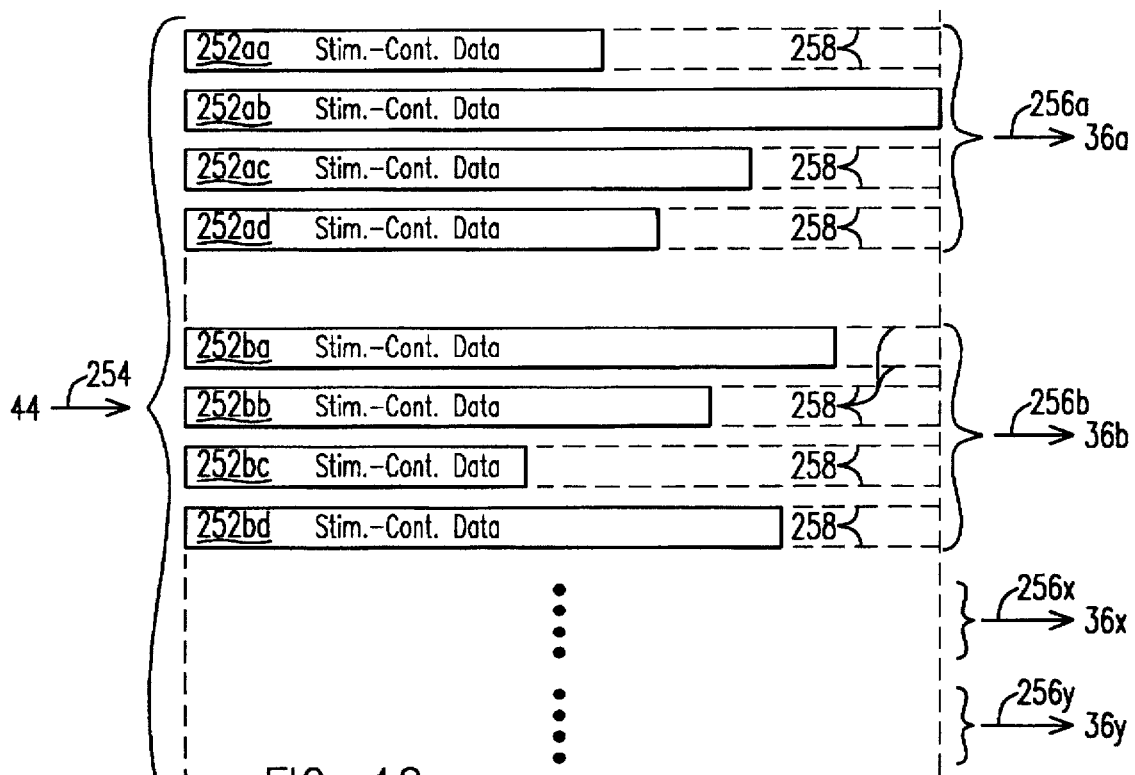
FIG. 18a is a diagram depicting sets of bit-slice stimulation-control data for downloading into different shift-registers in the configurable-logic ICs that are formed by interconnected stimulus/response cells.

As described previously, the length of the bit-slice stimulation-control data cannot be established or ascertained without knowing the type and sequence of stimulus/response cells 72 being connected into a shift-register by the shift-register links 74. In general, lengths of each of the four (4) shift-registers in each configurable-logic IC 36a or 36b will differ, and the four (4) shift-register lengths will differ between the configurable-logic ICs 36a and 36b. FIG. 18a illustrates differing lengths among the shift-registers in each of the configurable-logic ICs 36a and 36b. In the illustration of FIG. 18a, solid rectangular boxes depict the respective lengths of bit-slice stimulation-control data 252 for all four (4) shift-registers (a–b) included in each of the configurable-logic ICs 36a and 36b.

During transmission of bit-slice stimulation-control data 252 from the CPU 44, indicated by an arrow 254 in FIG. 18a, to the configurable-logic ICs 36a and 36b, indicated by arrows 256a and 256b, the digital logic simulation/emulation system 20, rather than attempting to employ digital logic within the configurable-logic ICs 36a and 36b that can properly load differing lengths of data into four (4) shift-registers, has the computer program executed by the CPU 44 provide the configurable-logic ICs 36a and 36b with bit-slice stimulation-control data 252 that are prefaced, if necessary, with additional irrelevant data indicated by dashed lines 258 extending to the right of the bit-slice stimulation-control data 252 in FIG. 18a. The data prefaced onto each of the bit-slice stimulation-control data 252 in this way extends the length of shorter bit-slice stimulation-control data 252 to equal the length of the longest bit-slice stimulation-control data 252. Because irrelevant data precedes the significant bit-slice stimulation-control data 252, the irrelevant data flows completely through and out of the shorter shift-registers established by interconnected stimulus/response cells 72. Thus, when all bit-slice stimulation-control data 252 have been loaded into the configurable-logic ICs 36a and 36b, each bit-slice stimulation-control data 252 is properly positioned within its shift-register.

Figure 18B:
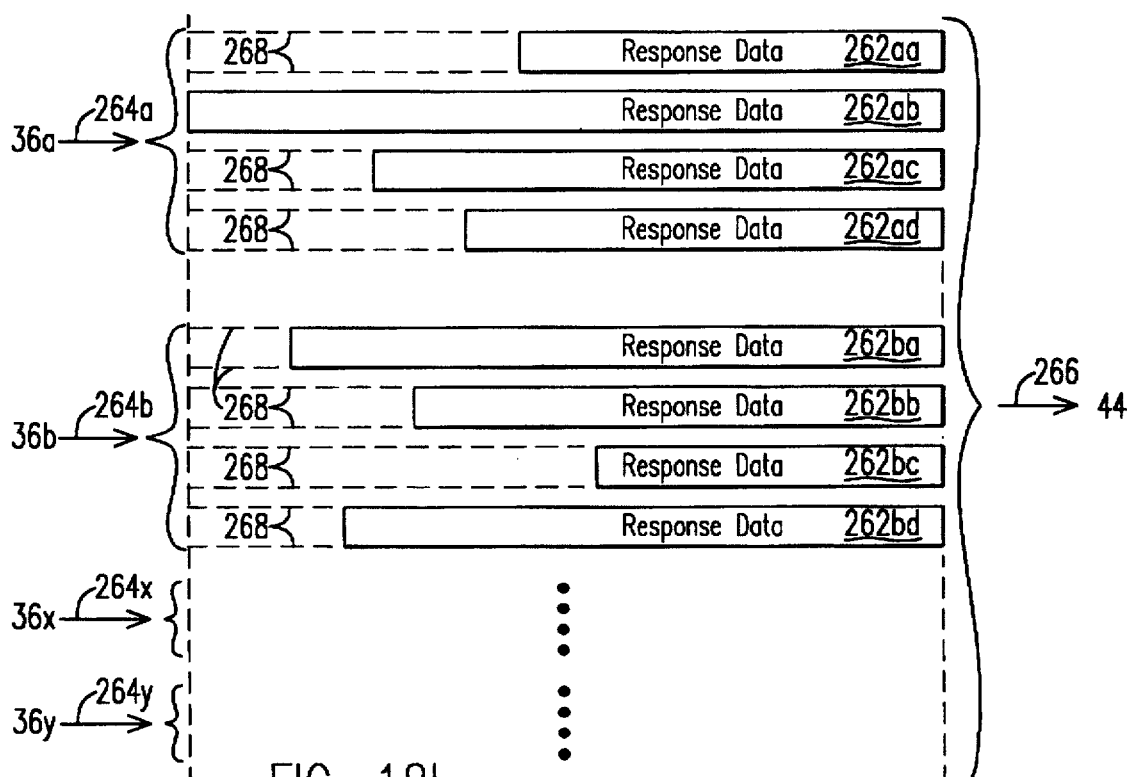
FIG. 18b is a diagram depicting sets of bit-slice response data uploaded from different shift-registers in the configurable-logic ICs that are formed by interconnected stimulus/response cells.

FIG. 18b illustrates retrieving response data from shift-registers of varying lengths in the configurable-logic ICs 36a and 36b. During transmission of bit-slice response data 262 from the configurable-logic ICs 36a and 36b, indicated by arrows 264a and 264b in FIG. 18b, to the CPU 44, indicated by an arrow 266 in FIG. 18b, the computer program executed by the CPU 44 retrieves the same amount of data from all shift-registers in both configurable-logic ICs 36a and 36b. However, the computer program executed by the CPU 44 retains only bit-slice response data 262 initially received for shorter shift-registers. As indicated by dashed lines 268 extending to the left in FIG. 18b from the bit-slice response data 262, the computer program executed by the CPU 44 discards all data retrieved from a shift-register that exceeds the shift-register's length.

For pedagogical reasons, thus far the description of the hardware pod 32 has been simplified somewhat from the preferred embodiment. While the hardware pod 32 illustrated in FIG. 1 depicts only two configurable-logic ICs 36a and 36b, a hardware pod 32 preferably may conveniently employ up to seven and one-half (7½) Atmel AT6005 FPGAs if the CPU 44 processes 32 bit data words. If the CPU 44 processes longer data words, then the hardware pod 32 may conveniently include more FPGAs. For example, if the CPU 44 processes 64 bit data words then the hardware pod 32 may include up to fifteen and one-half (15½) Atmel AT6005 FPGAs without degrading the performance of the digital logic simulation/emulation system 20.

The preceding limitations on the number of FPGAs that may be included in the hardware pod 32 arises from the way the CPU 44 and the configurable-logic ICs 36a and 36b exchange bit-slice stimulation-control data 252, and bit-slice response data 262. In transmitting bit-slice stimulation-control data 252 to the configurable-logic ICs 36a and 36b, the computer program executed by the CPU 44 assigns one bit from each bit-slice stimulation-control data 252 for all shift-registers to a single thirty-two bit computer data word 272 depicted in FIG. 19. Two (2) control bits 274 in each data word 272 are reserved for data which orchestrates operation of the state machine 76 in each configurable-logic IC 36. Each of the remaining thirty (30) bits in the data word 272 are available for assignment to one of the bit-slice stimulation-control data 252.

Referring again to FIG. 17, in transmitting successive data words 272 to the configurable-logic ICs 36 in accordance with the illustration of FIG. 18a, the computer program executed by the CPU 44 stores the control bits 274 into a pair of global FIFOs 276a and 276b included within the CPU 44. Concurrent with loading of the control bits 274 into the global FIFOs 276a and 276b, the remaining thirty (30) bits in the data word 272 are distributed, via a stimulus/response data-bus 278 also depicted in FIGS. 1 and 2, in four-bit groups 282, as illustrated in FIG. 19, to each configurable-logic IC 36. At each configurable-logic IC 36, each bit in the group 282 enters an input FIFO 284 depicted in FIG. 17. An output terminal of each input FIFO 284 connects to the input of one of the shift-registers formed by configuration data loaded into the configurable-logic IC 36.

Located within the CPU 44, the global operating-mode FIFO 276a transmits an operating-mode bit to the each state machine 76 included in all of the configurable-logic ICs 36 via an operating-mode signal-line 286 included in a control signal bus 288. One state of the operating-mode bit directs the state machine 76 to shift data along the shift-register formed by the interconnected stimulus/response cells 72. The other state of the operating-mode bit directs the state machine 76 to perform a stimulation-response cycle for the bit-slice stimulation-control data 252 then present in the shift-register.

In addition to receiving one of the control bits 274 which the global operating-mode FIFO 276a supplies to all of the state machines 76, the global operating-mode FIFO 276a also supplies a signal present at an "empty" terminal of the global operating-mode FIFO 276a to an input terminal of a two input-terminal OR gate 292. An output terminal of the OR gate 292 connects to an input terminal of a two input-terminal AND gate 294. A second input terminal of the AND gate 294 connects to a "full" output terminal of an output FIFO 296. A FIFO-ready signal-line 298 included in the control signal bus 288 couples an output terminal of the AND gate 294 to the state machines 76 included in all the configurable-logic ICs 36.

When the computer program executed by the CPU 44 stores data into the global operating-mode FIFO 276a directing the state machine 76 in each configurable-logic IC 36 to shift bit-slice stimulation-control data 252 into the shift-register, the state machines 76 transmit signals; to the input FIFOs 284 via a FIFO-operate signal-line 302, and to the stimulus/response cells 72 via the shift-pulse signal-line 146 included in the signal path 238; which cause a bit of the bit-slice stimulation-control data 252 to be transferred from the input FIFOs 284 to the shift-registers, and the data in the input FIFOs 284 to advance one position within the FIFO. One of the configurable-logic ICs 36 included in the hardware pod 32 also supplies the signal present on the FIFO-operate signal-line 302 to the global FIFOs 276a and 276b which causes data present in the FIFOs 276a and 276b to also advance one position.

Whenever the computer program executed by the CPU 44 places data into the global operating-mode FIFO 276a which directs the state machines 76 to transfer bit-slice stimulation-control data 252 into the shift-register, it also places data into the reset-FIFO 276b that is transmitted, via a output-FIFO-reset signal-line 304 included in the control signal bus 288, to a "reset" input terminal of all of the output FIFOs 296. In this way, while the bit-slice stimulation-control data 252 is being loaded into the shift-registers formed by interconnected stimulus/response cells 72, the output FIFOs 296 are completely disabled, and an output terminal the output FIFOs 296 tri-stated.

The control bits 274, loaded into the FIFOs 276a and 276b by the data word 272 immediately following the final data word 272 that contains bit-slice stimulation-control data 252, remove the reset signal from all of the output FIFOs 296, and cause the state machines 76 in all the configurable-logic ICs 36 to perform a stimulation-response cycle. Upon conclusion of the stimulation-response cycle, the CPU 44 supplies a shift-response-data signal to a second input of the OR gate 292 to initiate shifting of bit-slice response data 262 out of the configurable-logic ICs 36 into the respective output FIFOs 296. Upon transmission of the shift response-data signal, each state machine 76 commences transmitting signals to the stimulus/response cells 72 via the shift-pulse signal-line 146 included in the signal path 238, and to the output FIFOs 296 via the FIFO-operate signal-line 302 for shifting bit-slice response data 262 out of the shift-registers into the output FIFOs 296. The state machines 76 shift bit-slice response data 262 into the output FIFOs 296 until inhibited by arrival of the "full" signal supplied by one of the output FIFOs 296 to one input terminal of the AND gate 294.

After the configurable-logic IC 36 has loaded bit-slice response data 262 into the output FIFO 296, the computer program executed by the the CPU 44 then retrieves the bit-slice response data 262 from the output FIFOs 296 via the stimulus/response data-bus 278 as illustrated in FIG. 18b. To retrieve successive data words 272 of the bit-slice response data 262 from the output FIFOs 296, the computer program executed by the CPU 44 transmits a read signal to all of the output FIFOs 296 via a read-output-FIFO signal-line 308 included in the control signal bus 288. As the computer program retrieves successive data words 272 from the output FIFOs 296, the bit-slice response data 262 in the output FIFOs 296 advances, and the state machine 76 automatically fills the space thus created with more bit-slice response data 262 from the shift register until the computer program executed by the CPU 44 has retrieved all the bits making up the longest bit-slice response data 262.

While FIG. 17 depicts the FIFOs 276a and 276b as being only one-bit wide, the preferred embodiment of the hardware pod 32 utilizes one-half of a four-bit wide FIFO IC for the FIFOs 276a and 276b. Similarly, each configurable-logic IC 36 has associated with it one four-bit wide input FIFO 284, and one four-bit wide output FIFO 296.

Description of Software

Several different computer programs executed by the digital computer 24 and yet another computer program executed by the CPU 44 operate concurrently in the preferred embodiment of the digital logic simulation/emulation system 20. Microfiche Appendix I provides a source code program listings for each of these computer programs. All of the computer programs in Microfiche Appendix I, with the exception of the GUI computer program 226, are written in the C programming language that is well-known to those skilled in the art. The GUI computer program 226 is written in the Visual C++ programming language that is also well-known to those skilled in the art. The computer programs executed by the digital computer 24 run on a SparcStation 4 workstation manufactured by Sun Microsystems, Inc. of Mountain View, Calif. The computer program executed by the CPU 44 run on a Integrated Device Technology, Inc. R3081 RISC microprocessor. It is readily apparent to those skilled in the art that various other programming languages and/or digital computers could be used for alternative, equivalent implementations of this invention.

To prepare the simulation process 22, source code from directories named MODEL_CLIENT and COMMON set forth in Microfiche Appendix I are compiled together to obtain an object module called MODEL.O. The MODEL.O module is then linked together with a Verilog object module for the simulation to obtain the simulation process 22. To prepare the server process 62, source code from directories named SIMPOD_SERVER and COMMON are compiled and linked together. To prepare the computer program executed by the CPU 44, source code from directories SIMPOD_CLIENT, COMMON and USER_INFO are compiled and linked together. To prepare the GUI computer program 226, source code from the directory GUI is compiled and linked together. To prepare the computer program included in the configurable-logic specification process 224 which accepts the output data from the GUI computer program 226 and prepares a file-set 212, source code from directories COMPILE.X and USER_INFO are compiled and linked together.

Use of the System 20 for Emulation

Figure 20:
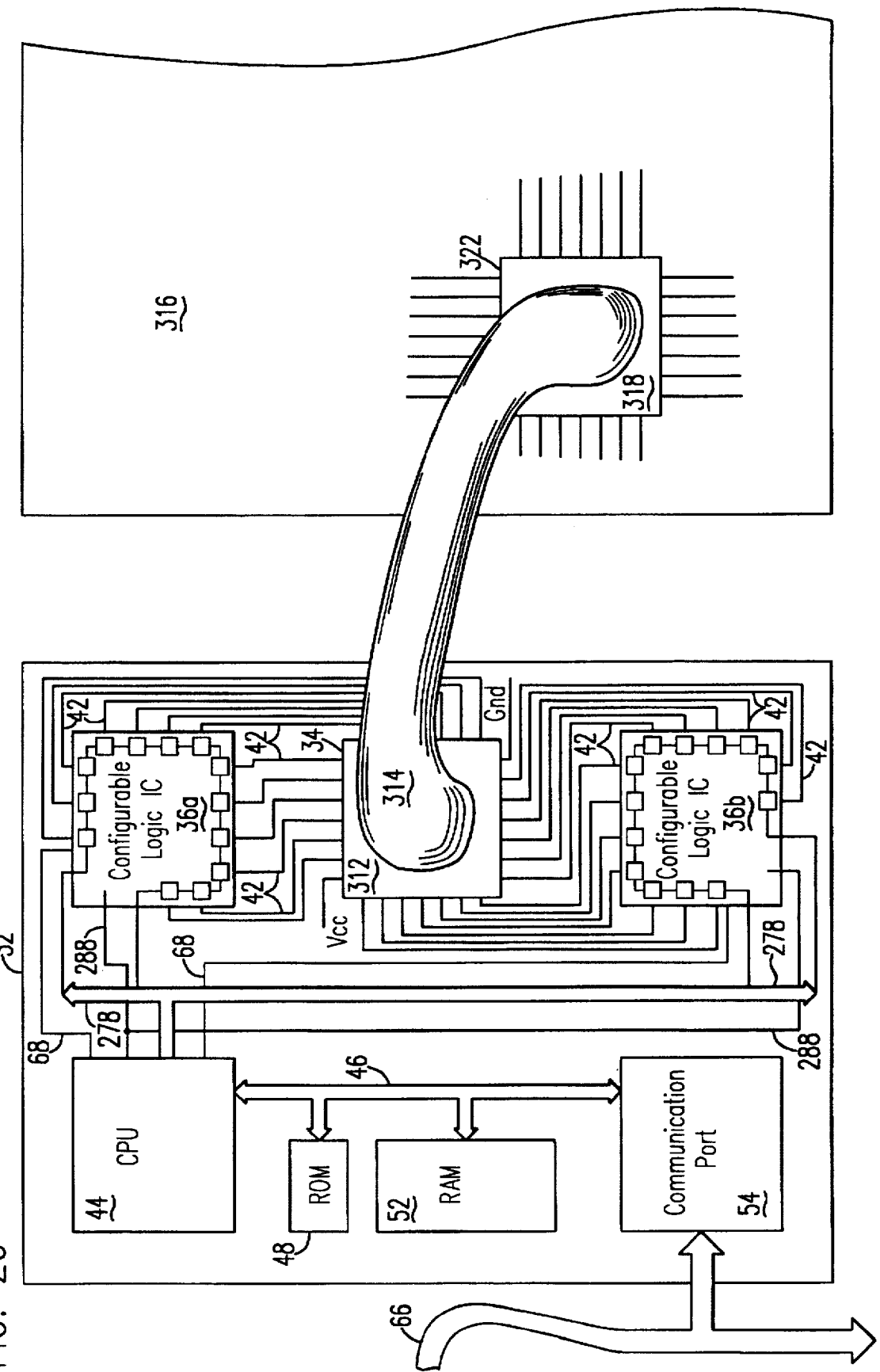
FIG. 20 is a block diagram depicting the pod of FIG. 1 coupled to a digital logic system by a multi-conductor cable.

The preceding description of the digital logic simulation/ emulation system 20 has focused exclusively on incorporating a digital logic IC into a simulation process 22. Alternatively, the entire preceding description could have focused exclusively on using the digital logic simulation/ emulation system 20 to emulate a digital logic IC's operation to a digital logic system. FIG. 20, illustrates one way in which the hardware pod 32 disclosed herein may be readily adapted for emulating a digital logic IC's operation. FIG. 20 depicts plugging a connector 312, attached to a first end of a multi-conductor cable 314, into the IC socket 34. A second end of the cable 314 connects to the digital logic circuit 316 that receives the digital logic IC's emulation. While FIG. 20 depicts a connector 318 at the second end of the cable 314 which is plugged into a socket 322 included in the digital logic circuit 316, in principle, the second end of the cable 314 could connect directly to the digital logic circuit 316. Alternatively, the IC socket 34 of the hardware pod 32 could be replaced with a connector that mates with and plugs into the socket 322. Clearly, since the digital logic simulation/ emulation system 20 requires only a minor mechanical adaptation for use in emulating a digital logic IC, the digital logic simulation/emulation system 20 is equally capable of being used either for simulation or for emulation.

Faster-Performance Simulation and Emulation

FIG. 21 depicts an alternative embodiment of the digital logic simulation/emulation system 20 adapted for use in faster-performance simulation or emulation. The digital logic simulation/emulation system 20 depicted in FIG. 21 eliminates the simulation process 22 and replaces it with a stimulation-control data-file 332. The stimulation-control data-file 332 consists of a sequence of bit-slice stimulation-control data 252 generated by the simulation process 22. Each bit-slice stimulation-control data 252 may be accompanied by the bit-slice response data 262 produced in response thereto. As illustrated in FIG. 21 by the arrow 334, the server process 62 may retrieve the stimulation-control data-file 332 and download it into the hardware pod 32. The computer program executed by the CPU 44 then uses the downloaded stimulation-control data-file 332 to exercise either a digital logic IC inserted into the IC socket 34, or as illustrated in FIG. 21, a digital logic circuit connected to the IC socket 34 by a cable 314. Within the hardware pod 32, the computer program CPU 44 compares the bit-slice response data 262 received by the configurable-logic ICs 36 with the bit-slice response data 262 in the stimulation-control data-file 332 to determine whether the digital logic IC or the digital logic circuit is functioning properly. Alternatively, configuration data may establish comparator digital logic circuits within the configurable-logic ICs 36 that compare the bit-slice response data 262 received by the configurable-logic ICs 36 with the bit-slice response data 262 in the stimulation-control data-file 332. In either way, only if a discrepancy occurs between the two sets of bit-slice response data 262 does the hardware pod 32 interrupt its repetitive operation to notify the server process 62 of the discrepancy.

Referring back to FIG. 3, the preceding faster-performance operating mode for the digital logic simulation/ emulation system 20 eliminates virtually all the overhead of a simulation or emulation to perform essentially only the stimulation-response cycle depicted along the bottom of FIG. 3. Thus, the alternative embodiment of the present invention depicted in FIG. 21 frees the hardware pod 32 to exercise a digital logic IC or a digital logic circuit at a speed limited only by the capabilities of the hardware pod 32.

IC Power-Checking

In addition to the various software modules and configuration data stored into each file-set 212 for use in a simulation or emulation, the configurable-logic specification process 224 also prepares a special set of software modules and configuration data which are stored into the logic-configuration library 86 for use in confirming that electrical power, such as VCC and Gnd, is not improperly connected to IC pin-receptacles 38. This special set of software modules and configuration data configure the configurable-logic ICs 36 for sensing voltages present on the IC pin-receptacles 38 and comparing such voltages with those specified using the screen display of FIG. 15 presented by the GUI computer program 226. An operator of the digital logic simulation/ emulation system 20 invokes these special IC power-checking software modules and configuration data by running a one-cycle simulation using a IC power-checking simulation process 22. If the IC power-checking simulation process 22 determines that electrical power is improperly connected to the IC pin-receptacles 38, then the simulation process 22 turns off electrical power, and concurrently "crow-bars" together the Vcc and Gnd planes of a printed circuit board used in constructing the hardware pod 32.

Although the present invention has been described in terms of the presently preferred embodiment, it is to be understood that such disclosure is purely illustrative and is not to be interpreted as limiting. For example, microprocessors other than the Integrated Device Technology, Inc. R3081 RISC microprocessor may be included in the CPU 44, or the hardware pod 32 may, in fact, entirely omit the CPU 44 and replace it with either a hardware state machine, perhaps implemented with a FPGA, or with an application specific integrated circuit ("ASIC"). Analogously, the communication port 54 may, in principle, be any bidirectional communication port. Accordingly, the communication port 54 may differ from the preferred Ethernet connection and be implemented using other communication ports such as a serial port, a parallel port, a 10 Base T port, a SCSI Bus port, etc. Similarly the configurable-logic ICs 36a and 36b may be a SRAM FPGA other than the preferred Atmel AT6005 FPGA, or may be implemented with an alternative configurable-logic IC technology such as an electrically erasable FPGA. Moreover, while in the presently preferred embodiment, the simulation process 22, server process 62, and the configurable-logic specification process 224 all execute on a single digital computer 24, each of these processes is sufficiently independent of the other that, if desired, each process could execute on a separate digital computer.

While the digital logic simulation/emulation system 20 has been described thus far for use in simulating or emulating an entire IC, it may also be applied for effectively and efficiently simulating or emulating only a portion of an IC. An enterprise which desires to provide a second enterprise with access to the first enterprise's design for a core of an IC without divulging details of the IC's design may store the core design into a configurable logic IC such as an electrically erasable FPGA. The first enterprise then delivers the configured FPGA IC to the second enterprise together with a document specifying a functionality for all of the FPGA's pins. By entering the specification for the configured IC into the digital logic simulation/emulation system 20 using the GUI computer program 226, and by inserting the configured IC into the IC socket 34, the second enterprise may then effectively and efficiently incorporate the core design into the second enterprise's simulation for the second enterprise's IC design. In this way the second enterprise may efficiently assess the suitability of the first enterprise's core design without having access to details about the core design.

While the method for determining configuration data for the configurable-logic IC 36 by juxtaposing configuration data for stimulus/response cells 72 described herein occurs in the context of exchanging stimulus/response signals with a digital logic IC or circuit, the method is applicable in other contexts of digital logic design. For example, bit-slice adders and arithmetic-logical units ("ALU") are well known in the art. Accordingly, if logical-function cells were pre-established in the configurable-logic cell-library 232 which performed such bit-slice arithmetic/logical functions, and the GUI computer program 226 were suitably adapted to permit assigning particular arithmetic/logical functions to particular pins of the configurable-logic IC 36, then the method for swiftly determining configuration for the configurable-logic IC 36 may be used for establishing a computational digital logic IC within a FPGA.

Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A digital logic simulation/emulation system comprising:
   a computer program digital-logic simulation process executed by a digital computer for modeling a digital logic system;
   a hardware pod that:
      is adapted for being coupled to a digital logic circuit;
      includes a configurable-logic integrated circuit ("IC") which is arranged to include a plurality of stimulus/response cells for providing stimulus signals to the digital logic circuit during a stimulation-response cycle, and for receiving responses from the digital logic circuit during the stimulation-response cycle; and
      further includes a communication port for receiving stimulation-control data to be transmitted to the configurable-logic IC for controlling stimulation of the digital logic circuit by the configurable-logic IC during the stimulation-response cycle, and for receiving for transmission from said hardware pod response data which the configurable-logic IC receives from the digital logic circuit in response to stimulation thereof during the stimulation-response cycle; and
   a server process, coupled both to said digital-logic simulation process and to said hardware pod, for exchanging stimulation-control data and response data between said digital-logic simulation process and said hardware pod, whereby said digital-logic simulation process may transmit stimulation-control data through said server process to said hardware pod for controlling stimulation of the digital logic circuit by the stimulus/response cells during the stimulation-response cycle, and whereby said digital-logic simulation process may receive from said hardware pod through said server process response data from stimulus/response cells of the configurable-logic IC that reports the response of the digital logic circuit to stimulation during the stimulation-response cycle.

2. The digital logic simulation/emulation system of claim 1 further comprising a logic-configuration library which stores a configuration-data file that contains logic-configuration data which, upon being loaded into the configurable-logic IC of said hardware pod, establishes the plurality of stimulus/response cells in said configurable-logic IC, said logic-configuration library being coupled to said server process whereby said server process may retrieve the configuration-data file from said logic-configuration library and transmit the logic-configuration data to said hardware pod for configuring the configurable-logic IC.

3. The digital logic simulation/emulation system of claim 2 wherein the logic-configuration data, upon being loaded into the configurable-logic IC of said hardware pod, also establishes within the configurable-logic IC, in addition to the plurality of stimulus/response cells:
   a state machine for controlling the operation of the configurable-logic IC in providing stimulus signals to the digital logic circuit and in receiving responses from the digital logic circuit; and
   a timing generator controlled by the state machine which establishes time intervals within the stimulation-response cycle during which individual stimulus/response cells either provides a stimulus signal to the digital logic circuit and/or receive a response from the digital logic circuit.

4. The digital logic simulation/emulation system of claim 3 further comprising:
   a configurable-logic cell-library which stores configuration data that specifies various different types of individual stimulus/response cells; and
   a configurable-logic-specification process, coupled both to said configurable-logic cell-library and to said logic-configuration library, which provides a user interface that permits:
      selecting an individual stimulus/response cell from the configurable-logic cell-library for inclusion into a configuration-data file to be stored into said logic-configuration library;
      specifying a location for the selected stimulus/response cell with respect to the digital logic circuit;
      specifying a time interval within the stimulation-response cycle during which the selected stimulus/response cell is to operate for providing a stimulus signal to the digital logic circuit and/or receiving a response from the digital logic circuit;
      aggregating a plurality of selected and specified stimulus/response cells into a configuration-data file that may be stored into said logic-configuration library; and storing the configuration-data file thus aggregated into said logic-configuration library.

5. The digital logic simulation/emulation system of claim 2 wherein the stimulus/response cells established upon loading the configuration-data file into the configurable-logic IC of said hardware pod form a bit-slice architecture in which stimulus/response cells are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

6. The digital logic simulation/emulation system of claim 2 wherein the stimulus/response cells established upon loading the configuration-data file into the configurable-logic IC of said hardware pod are divided into a plurality of separate stimulus/response-cell groups, the stimulus/response cells of each separate stimulus/response-cell group forming a bit-slice architecture in which stimulus/response cells of the stimulus/response-cell group are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

7. The digital logic simulation/emulation system of claim 6 wherein there are four (4) separate stimulus/response-cell groups.

8. The digital logic simulation/emulation system of claim 1 wherein the stimulus/response cells form a bit-slice architecture in which stimulus/response cells are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

9. The digital logic simulation/emulation system of claim 1 wherein the stimulus/response cells are divided into a plurality of separate stimulus/response-cell groups, the stimulus/response cells of each separate stimulus/response-cell group forming a bit-slice architecture in which stimulus/response cells of the stimulus/response-cell group are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

10. The digital logic simulation/emulation system of claim 9 wherein there are four (4) separate stimulus/response-cell groups.

11. The digital logic simulation/emulation system of claim 1 wherein the hardware pod further includes:

a random access memory ("RAM") for storing stimulation-control data for a sequence of successive stimulation-response cycles including stimulation-control data for an initial stimulation-response cycle and stimulation-control data for a final stimulation-response cycle; and means for selecting stimulation-control data for successive stimulation-response cycles from the RAM beginning with the initial stimulation-response cycle and ending with the final stimulation-response cycle, and for transmitting each successive stimulation-control data to the configurable-logic IC for providing the digital logic circuit with a sequence of stimulus signals, the hardware pod transmitting response data for the final stimulation-response cycle in the sequence of stimulus signals to said server process for re-transmission to said digital-logic simulation process.

12. The digital logic simulation/emulation system of claim 1 wherein a computer program executed by a digital computer provides the server process.

13. The digital logic simulation/emulation system of claim 12 wherein the computer program digital-logic simulation process and the computer program server process are both executed by the same digital computer.

14. The digital logic simulation/emulation system of claim 12 wherein the computer program digital-logic simulation process and the computer program server process are executed by different digital computers.

15. A hardware pod that is adapted for being coupled to a digital logic circuit, and is also adapted for incorporation into a digital logic simulation/emulation system that includes a computer program digital-logic simulation process executed by a digital computer for modeling a digital logic system, the digital logic simulation/emulation system also including a server process, coupled both to the digital-logic simulation process and to the hardware pod, for exchanging stimulation-control data and response data between the digital-logic simulation process and the hardware pod, the hardware pod comprising:

a configurable-logic IC which is arranged to include a plurality of stimulus/response cells for providing stimulus signals to the digital logic circuit during a stimulation-response cycle, and for receiving responses from the digital logic circuit during the stimulation-response cycle; and a communication port for receiving stimulation-control data to be transmitted to the configurable-logic IC for controlling stimulation of the digital logic circuit by the configurable-logic IC during the stimulation-response cycle, and for receiving for transmission from the hardware pod response data which the configurable-logic IC receives from the digital logic circuit in response to stimulation thereof during the stimulation-response cycle;

whereby the digital-logic simulation process may transmit stimulation-control data through the server process to the hardware pod for controlling stimulation of the digital logic circuit by the stimulus/response cells during the stimulation-response cycle, and whereby the digital-logic simulation process may receive from the hardware pod through the server process response data from stimulus/response cells of the configurable-logic IC that reports the response of the digital logic circuit to stimulation during the stimulation-response cycle.

16. The hardware pod of claim 15 wherein logic-configuration data, upon being loaded into the configurable-logic IC of the hardware pod, also establishes within the configurable-logic IC, in addition to the plurality of stimulus/response cells:

a state machine for controlling the operation of the configurable-logic IC in providing stimulus signals to the digital logic circuit and in receiving responses from the digital logic circuit; and a timing generator controlled by the state machine which establishes time intervals within the stimulation-response cycle during which individual stimulus/response cells either provides a stimulus signal to the digital logic circuit and/or receive a response from the digital logic circuit.

17. The hardware pod of claim 15 wherein the stimulus/response cells form a bit-slice architecture in which stimulus/response cells are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

18. The hardware pod of claim 15 wherein the stimulus/response cells are divided into a plurality of separate stimulus/response-cell groups, the stimulus/response cells of each separate stimulus/response-cell group forming a bit-slice architecture in which stimulus/response cells of the stimulus/response-cell group are coupled to each other to establish a shift-register for downloading into the configurable-logic IC stimulation-control data of a bit-slice data stream which specifies stimulation of the digital logic circuit by the configurable-logic IC during the stimulation-response cycle, and for uploading from the configurable-logic IC response data of a bit-slice data stream that reports the response of the digital logic circuit to stimulation during the stimulation-response cycle.

19. The hardware pod of claim 18 wherein there are four (4) separate stimulus/response-cell groups.

20. The hardware pod of claim 15 wherein the hardware pod further includes:

a RAM for storing stimulation-control data for a sequence of successive stimulation-response cycles including stimulation-control data for an initial stimulation-response cycle and stimulation-control data for a final stimulation-response cycle; and means for selecting stimulation-control data for successive stimulation-response cycles from the RAM beginning with the initial stimulation-response cycle and ending with the final stimulation-response cycle, and for transmitting each successive stimulation-control data to the configurable-logic IC for providing the digital logic circuit with a sequence of stimulus signals, the hardware pod transmitting response data for the final stimulation-response cycle in the sequence of stimulus signals to the server process for re-transmission to the digital-logic simulation process.

21. A method for swiftly determining configuration data to be used for configuring a configurable-logic IC for performing specified digital logic functions, the configurable-logic IC including an array of configurable-logic cells that may be logically interconnected by the configuration data to perform specific digital logic functions, the method comprising the steps of:

determining, for a plurality of logic-function cells to be established within the configurable-logic IC, a digital logic function to be performed by each such logic-function cell;

retrieving from a configurable-logic cell-library, which stores configuration data that specifies various different types of individual logic-function cells, configuration data for each logic-function cell in the plurality of logic-function cells, the configuration data retrieved for each logic-function cell specifying a pre-established interconnection of several configurable-logic cells included in the configurable-logic IC which, upon loading of such configuration data into a configurable-logic IC, establishes by interconnecting several configurable-logic cells a digital logic circuit within the configurable-logic IC that performs the digital logic functions specified for that logic-function cell; and determining the configuration data to be used for configuring a configurable-logic IC merely by assigning to specific locations throughout the configurable-logic IC the configuration data retrieved from the configurable-logic cell-library for each of the logic-function cells.

22. The method of claim 21 wherein assignment of configuration data for a pair of logic-function cells to specific locations within the configurable-logic IC includes merely juxtaposing configuration data for that pair of logic-function cells, the configuration data for the pair of logic-function cells so juxtaposed also establishing a signal path for exchanging a data signal between the pair of juxtaposed logic-function cells.

23. The method of claim 22 wherein the signal path for exchanging the data signal between the juxtaposed pair of logic-function cells passes completely across the pair of juxtaposed logic-function cells whereby the juxtaposed logic-function cells establish a signal path for transmitting a data signal through both juxtaposed logic-function cells to a third logic-function cell that may be juxtaposed with one of the two logic-function cells in the pair of logic-function cells.

24. The method of claim 22 wherein the signal path for exchanging the data signal between the juxtaposed pair of logic-function cells connects the pair of logic-function cells into a shift-register.

25. The method of claim 21 wherein the configuration data to be used for configuring a configurable-logic IC also includes configuration data that establishes within the configurable-logic IC:

a timing-signal bus, the configuration data for the logic-function cells also specifying a connection of each logic-function cell to the timing-signal bus; and a timing generator that connects to the timing-signal bus and operation of which establishes time intervals that are transmitted over the timing-signal bus to the logic-function cell connected thereto for controlling operation of such individual logic-function cells.

26. The method of claim 25 wherein the configuration data to be used for configuring a configurable-logic IC also includes configuration data that establishes a state machine within the configurable-logic IC for controlling operation of the timing generator.

27. A faster-performance digital logic simulation/emulation system comprising:

stimulation-control data that specifies stimulation-response-cycle data to be to be applied to a digital logic circuit during stimulation-response cycles;

a hardware pod that:
is adapted for receiving the stimulation-response-cycle data, and for being coupled to the digital logic circuit;

includes a configurable-logic IC which is arranged to include a plurality of stimulus/response cells for providing stimulus signals to the digital logic circuit during the stimulation-response cycles, and for receiving responses from the digital logic circuit during the stimulation-response cycles; and further includes a communication port for receiving stimulation-response-cycle data to be transmitted to the configurable-logic IC for controlling stimulation of the digital logic circuit by the configurable-logic IC during the stimulation-response cycles; and a server process, coupled to said hardware pod for supplying stimulation-response-cycle data to said hardware pod, whereby stimulation-response-cycle data supplied by said server process to said hardware pod controls stimulation of the digital logic circuit by the stimulus/response cells during the stimulation-response cycles.

28. The digital logic simulation/emulation system of claim 27 further comprising a logic-configuration library which stores a configuration-data file that contains logic-configuration data which, upon being loaded into the configurable-logic IC of said hardware pod, establishes the plurality of stimulus/response cells in said configurable-logic IC, said logic-configuration library being coupled to said server process whereby said server process may retrieve the configuration-data file from said logic-configuration library and transmit the logic-configuration data to said hardware pod for configuring the configurable-logic IC.

29. The digital logic simulation/emulation system of claim 28 wherein the logic-configuration data, upon being loaded into the configurable-logic IC of said hardware pod, also establishes within the configurable-logic IC, in addition to the plurality of stimulus/response cells:

a state machine for controlling the operation of the configurable-logic IC in providing stimulus signals to the digital logic circuit and in receiving responses from the digital logic circuit; and a timing generator controlled by the state machine which establishes time intervals within the stimulation-response cycles during which individual stimulus/response cells either provides a stimulus signal to the digital logic circuit and/or receive responses from the digital logic circuit.

30. The digital logic simulation/emulation system of claim 28 wherein the logic-configuration data, upon being loaded into the configurable-logic IC of said hardware pod, also establishes within the configurable-logic IC, in addition to the plurality of stimulus/response cells:

a comparator digital-logic-circuit for comparing with response data included in the stimulation-response-cycle data received by the communication port the responses that the configurable-logic IC receives from the digital logic circuit.

31. The digital logic simulation/emulation system of claim 28 wherein the stimulus/response cells established upon loading the configuration-data file into the configurable-logic IC of said hardware pod form a bit-slice architecture in which stimulus/response cells are coupled to each other to establish a shift-register for downloading into the configurable-logic IC stimulation-control data of a bit-slice data stream which specifies stimulation of the digital logic circuit by the configurable-logic IC during the stimulation-response cycles.

32. The digital logic simulation/emulation system of claim 28 wherein the stimulus/response cells established upon loading the configuration-data file into the configurable-logic IC of said hardware pod are divided into a plurality of separate stimulus/response-cell groups, the stimulus/response cells of each separate stimulus/response-cell group forming a bit-slice architecture in which stimulus/response cells of the stimulus/response-cell group are coupled to each other to establish a shift-register for downloading into the configurable-logic IC stimulation-control data of a bit-slice data stream which specifies stimulation of the digital logic circuit by the configurable-logic IC during the stimulation-response cycles.

33. The digital logic simulation/emulation system of claim 32 wherein there are four (4) separate stimulus/response-cell groups.

34. The digital logic simulation/emulation system of claim 27 wherein the configurable-logic IC further includes a comparator digital-logic-circuit for comparing with response data included in the stimulation-response-cycle data received by the communication port the responses that the configurable-logic IC receives from the digital logic circuit.

35. The digital logic simulation/emulation system of claim 27 wherein the stimulus/response cells form a bit-slice architecture in which stimulus/response cells are coupled to each other to establish a shift-register for downloading into the configurable-logic IC stimulation-control data of a bit-slice data stream which specifies stimulation of the digital logic circuit by the configurable-logic IC during the stimulation-response cycles.

36. The digital logic simulation/emulation system of claim 27 wherein the stimulus/response cells are divided into a plurality of separate stimulus/response-cell groups, the stimulus/response cells of each separate stimulus/response-cell group forming a bit-slice architecture in which stimulus/response cells of the stimulus/response-cell group are coupled to each other to establish a shift-register for downloading into the configurable-logic IC stimulation-control data of a bit-slice data stream which specifies stimulation of the digital logic circuit by the configurable-logic IC during the stimulation-response cycles.

37. The digital logic simulation/emulation system of claim 36 wherein there are four (4) separate stimulus/response-cell groups.

38. The digital logic simulation/emulation system of claim 27 wherein the hardware pod further includes:

a RAM for storing stimulation-control data for a sequence of successive stimulation-response cycles including stimulation-control data for an initial stimulation-response cycle and stimulation-control data for a final stimulation-response cycle; and means for selecting stimulation-control data for successive stimulation-response cycles from the RAM beginning with the initial stimulation-response cycle and ending with the final stimulation-response cycle, and for transmitting each successive stimulation-control data to the configurable-logic IC for providing the digital logic circuit with a sequence of stimulus signals.

39. The digital logic simulation/emulation system of claim 38 wherein the hardware pod further includes central processing unit ("CPU"), and wherein the configurable-logic IC transmits the responses received from the digital logic circuit to said CPU for comparison with response data included in the stimulation-response-cycle data received by the communication port.

40. The digital logic simulation/emulation system of claim 27 wherein a computer program executed by a digital computer provides the server process.

* * * * *